US011384102B2

(12) United States Patent
Herritsch et al.

(10) Patent No.: US 11,384,102 B2
(45) Date of Patent: Jul. 12, 2022

(54) LITHIUM ALKYL ALUMINATES AS ALKYL TRANSFER REAGENTS

(71) Applicant: Umicore AG & Co. KG, Hanau-Wolfgang (DE)

(72) Inventors: Susanne Herritsch, Marburg (DE); Joerg Sundermeyer, Marburg (DE)

(73) Assignee: Umicore AG & Co. KG, Hanau-Wolfgang (DE)

( * ) Notice: Subject to any disclaimer, the term of this patent is extended or adjusted under 35 U.S.C. 154(b) by 0 days.

(21) Appl. No.: 17/312,761

(22) PCT Filed: Nov. 28, 2019

(86) PCT No.: PCT/EP2019/082884
§ 371 (c)(1),
(2) Date: Jun. 10, 2021

(87) PCT Pub. No.: WO2020/120148
PCT Pub. Date: Jun. 18, 2020

(65) Prior Publication Data
US 2022/0041631 A1    Feb. 10, 2022

(30) Foreign Application Priority Data
Dec. 11, 2018  (EP) ..................................... 18211763

(51) Int. Cl.
*C07F 5/06*    (2006.01)
(52) U.S. Cl.
CPC .................................... *C07F 5/062* (2013.01)
(58) Field of Classification Search
None
See application file for complete search history.

(56) References Cited

U.S. PATENT DOCUMENTS

2005/0033073 A1    2/2005    Shenai-Khatkhate et al.

FOREIGN PATENT DOCUMENTS

EP    0307717 A2    3/1989
WO    95/04168 A1    2/1995

OTHER PUBLICATIONS

Ashby et al., "Nature of Alkyl-Hydrogen Exchange Reactions Involving Aluminum and Zinc. 5. Reactions of Diphenylzinc with Lithium Aluminum Hydride in Diethyl Ether and Tetrahydrofuran. Preparation of PliZn2H3", Inorg, Chem., vol. 20, pp. 1096-1101.
Goel et al., "The Reaction between Dimethylmagnesium and Lithium Aluminum Hydride in Diethyl Ether and Tetrahydrofuran", Inorgánica Chimica Acta, vol. 87, No. 1, Aug. 1, 1984, pp. 61-65.
Hitchcock et al., "Synthesis and structures of halides and pseudohalides of bis[2,6-bis(dimethylamino)phenyl]tin(iv)", Dalton Transactions, No. 2, Jan. 1, 2009, pp. 353-361.
International Preliminary Reporton Patentability received for PCT Patent Application No. PCT/EP2019/082884, dated Jun. 24, 2021, 51 pages (30 pages of English Translation and 21 pages of Original Document).
International Search Report and Written Opinion received for PCT Patent Application No. PCT/EP2019/082884, dated May 13, 2020, 59 pages (31 pages of English Translation and 28 pages of Original Document).
Pasto et al., "Lithium Aluminum Methide as an Alkylating Agent", Journal of Organic Chemistry, vol. 30, No. 5, May 1965, pp. 1634-1635.
Database CA [Online] Chemical Abstracts Service, Columbus, Ohio, US; 1966, "Ethylene-propylene terpolymers and their vulcanization", XP002792314, gefunden im STN Database accession No. 1966:448621.
Database CA [Online] Chemical Abstracts Service, Columbus, Ohio, US; 1968, "Curable, amorphous, Tinear terpolymers of ethylene, an .alpha.-olefin, and an orthocondensed polycyclic polyene", XP002792313, gefunden i m STN Database accession No. 1968:13892.
Database CA [Online] Chemical Abstracts Service, Columbus, Ohio, US; 1965, Iwamoto, Masao et al: "Catalysts for ethylene polymerization", XP002792316, gefunden im STN Database accession No. 1965:499007.
Database CA [Online] Chemical Abstracts Service, Columbus, Ohio, US; 1998, Kibino, Nobuyuki et al: "Metallocene-based polymerization catalysts and preparation of polyolefins using them", XP002792315, gefunden im STN Database accession No. 1998:289628.
Database Reaxys [Online] Elsevier; 1987, Pritytskaya: XP002795321, Database accession No. 27021291.
Kroto et al., "The microwave spectrum of phosphaethene, CH 2 (Ph", Journal of the Chemical Society, Chemical Communications, vol. 0, No. 15, Jan. 1, 1980, pp. 709a-709a.
Mukaiyama et al., "Regioselective Alkylation of I,3-Dioxolan-2-ylium Cation Derived from [alpha],[beta]-Unsaturated Aldehyde Ethylene Acetal with Lithium Organo Compounds", Chemistry Letters, vol. 15, No. 9, Sep. 5, 1986, pp. 1627-1630.

(Continued)

*Primary Examiner* — Joseph R Kosack
(74) *Attorney, Agent, or Firm* — Faegre Drinker Biddle & Reath LLP

(57) ABSTRACT

The invention relates to lithium alkyl aluminates according to the general formula $Li[AlR_4]$ and to a method for preparing same, starting from $LiAlH_4$ and RLi in an aprotic solvent. The invention also relates to compounds according to the general formula $Li[AlR_4]$ which can be obtained using the claimed method, and to the use thereof. The invention also relates to the use of a lithium alkyl aluminate $Li[AlR_4]$ as a transfer reagent for transferring at least one radical R to an element halide or metal halide and to a method for transferring at least one radical R to a compound $E(X)_q$ for preparing a compound according to the general formula $E(X)_{q-p}R_p$, where E=aluminium, gallium, indium, thallium, germanium, tin, lead, antimony, bismuth, zinc, cadmium, mercury, or phosphorus, X=halogen, q=2, 3 or 4, and p=1, 2, 3 or 4. The invention also relates to compounds which can be obtained using such a method, to the use thereof, and to a substrate which has an aluminium layer or a layer containing aluminium on one surface.

13 Claims, 7 Drawing Sheets

(56) References Cited

OTHER PUBLICATIONS

Figure 1:
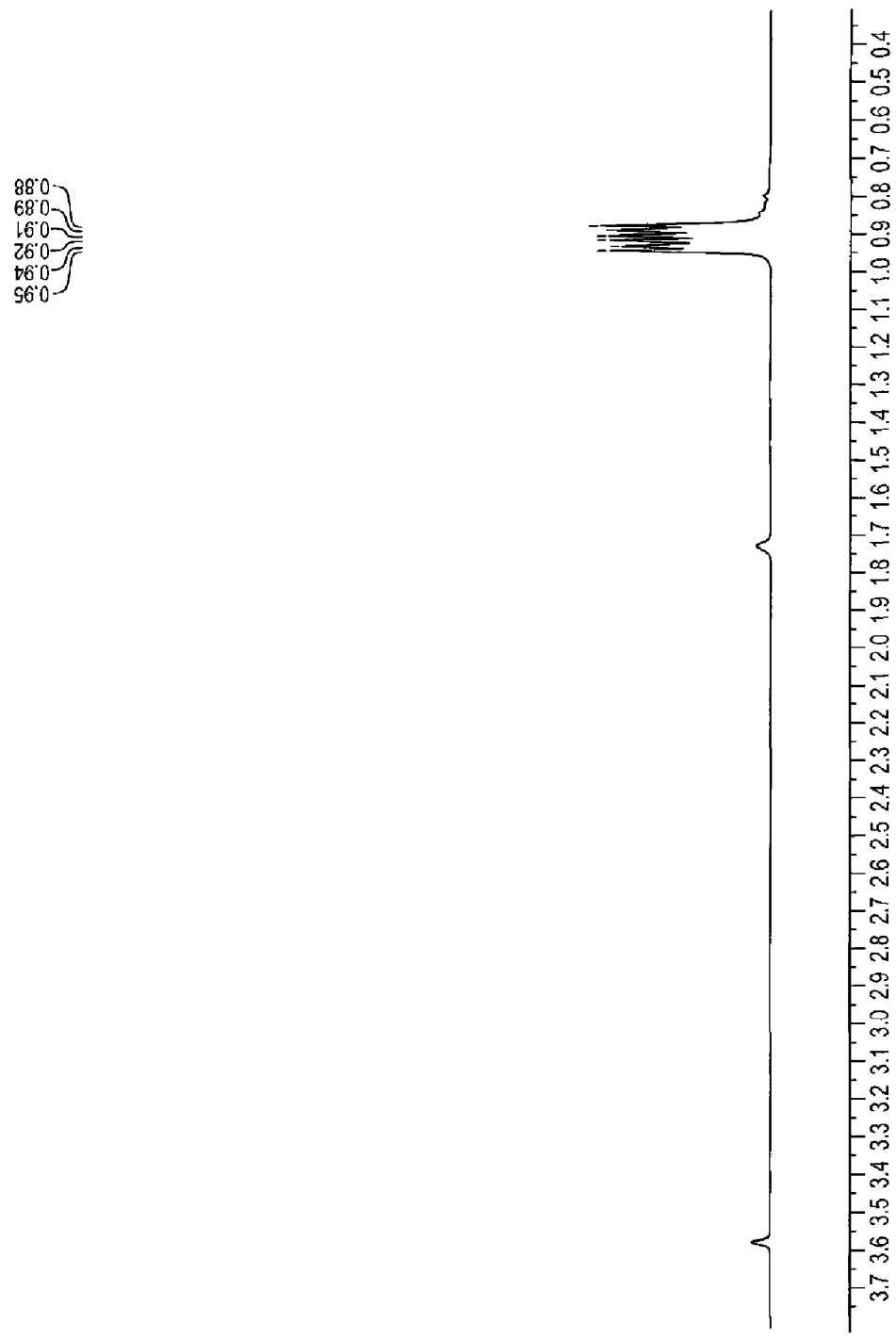

Sizov et al., "Synthesis and properties of unsolvated bis(cyclopentadienyl)titanium alumohydride . . . ", Journal of Organometallic Chemistry, vol. 603, No. 2, May 29, 2000, pp. 167-173.

Wrackmeyer et al., "Spin-Spin Coupling Constants 1J(27Al,13C) and 1J(I3C,11B) in Comparable Organoaluminum and -boron Compounds NMR Spectroscopy of Lithium Tetra(tert-butyl)alanate", Z. Naturforsch. 2008, pp. 923-928.

LITHIUM ALKYL ALUMINATES AS ALKYL TRANSFER REAGENTS

CROSS-REFERENCE TO RELATED APPLICATIONS

This application is a national stage application (under 35 U.S.C. § 371) of PCT/EP2019/082884, filed Nov. 28, 2019, which claims benefit of European Application No. 18211763.0, filed Dec. 11, 2018, both of which are incorporated herein by reference in their entirety.

The invention relates to lithium alkyl aluminates according to the general formula Li[AlR$_4$]. R is selected from the group consisting of a (C1-C10) alkyl radical, a partially or fully halogenated (C1-C10) alkyl radical, a (trialkylsilyl) alkyl radical R$^A$Si(R$^B$)$_3$, a benzyl radical, a partially or fully substituted benzyl radical, a mononuclear or polynuclear arene, a partially or fully substituted mononuclear or polynuclear arene, a mononuclear or polynuclear heteroarene and a partially or fully substituted mononuclear or polynuclear heteroarene. R$^A$ is selected from the group consisting of a (C1-C6) alkylene radical and a partially or fully halogenated (C1-C6) alkylene radical. R$^B$ radicals are selected independently of one another from the group consisting of a (C1-C10) alkyl radical, a partially or fully halogenated (C1-C10) alkyl radical and an O—R$^E$ alkyl ether radical. Radicals R$^E$ are selected independently of one another from the group consisting of a (C1-C10) alkyl radical, a partially or fully halogenated (C1-C10) alkyl radical, a benzyl radical, a partially or fully substituted benzyl radical, a mononuclear or polynuclear arene, a partially or fully substituted mononuclear or polynuclear arene, a mononuclear or polynuclear heteroarene and a partially or fully substituted mononuclear or polynuclear heteroarene. The invention further relates to the use of a lithium alkyl aluminate according to the general formula Li[AlR$_4$] as a transfer reagent for transmitting at least one radical R and to a method for transmitting at least one radical R to a compound according to the general formula E(X)$_q$ for the preparation of a compound according to the general formula E(X)$_{q-p}$R$_p$. R is as defined above, E is selected from the group consisting of aluminum, gallium, indium, thallium, germanium, tin, lead, antimony, bismuth, zinc, cadmium, mercury and phosphorus, X=halogen, q=2, 3 or 4, and p=1, 2, 3 or 4. The invention also relates to compounds which can be obtained using such a method, to the use thereof, and to a substrate which has an aluminum layer or a layer containing aluminum on one surface. The invention moreover relates to a method for the preparation of lithium alkyl aluminates according to the general formula Li[AlR$_4$], compounds obtainable by the claimed method, and to the use thereof.

Metathetic transfers of alkyl groups to element and metal halides play an important role in a variety of synthetic sequences. They are also carried out on an industrial scale. Lithium organyls LiR or Grignard reagents RMgX are usually used as transfer reagents.

When using lithium organyls, the formation of LiX as a byproduct constitutes the driving force of the reaction. In addition, lithium organyls are readily soluble in aliphatic, nonpolar solvents. Owing to their reactivity, however, they are not universally applicable for all reaction systems. Disadvantages of lithium organyls are, in particular, their high reducing capacity, which they possess due to their high electropositive character and their nucleophilicity, the strong exothermicity of the reactions in which they are involved, and the associated loss of selectivity. In addition, the quantitative separation of the salt load obtained as a byproduct, in particular from the polar solvents usually used, is an intractable challenge. This applies in particular with regard to their use on an industrial scale.

Grignard reagents are relatively inexpensive to access. Syntheses in which they are used generally exhibit good reproducibility. However, the use of ethereal solvents is absolutely necessary when they are used. This can lead to problems in the later application of the respective target compound. This means that if Grignard reagents are used, for example, in the production of precursors for a vapor deposition method or a vapor phase epitaxy method, there is a risk that the precursor compounds produced may have impurities in the form of oxygen traces. As a result, there may be a deposition of contaminated metal layers or metal-containing layers that are unusable for a further application.

Aluminum, zinc, and silicon alkyls, such as, for example, AlR$_3$, ZnR$_2$ and SiR$_4$ are also used. The disadvantage of these alkylating agents is that they are usually synthesized starting from RLi or RMgX.

Overall, the alkylation reagents known from the literature are to be classed as unsatisfactory, on the one hand because of their comparatively low selectivity and difficult-to-separate LiX load, and on the other hand because of the unavoidable use of an ethereal solvent and the consequential problems possibly associated therewith.

The object of the invention is therefore to overcome these and other disadvantages of the prior art and to provide compounds that are suitable for use as transfer reagents for the transfer of at least one alkyl radical. The compounds to be used are to be characterized by the fact that they allow selective transfer of one or more alkyl radicals in which by-products that are comparatively easy to separate are obtained. Furthermore, a simple and cost-effective method for the transfer of at least one alkyl radical is to be provided, as well as compounds obtainable by means of such a method in a relatively simple, cost-effective and selective way and in high purity. In addition, a substrate is to be provided that has an aluminum layer or a layer containing aluminum on one surface, which can be produced using a compound obtainable or obtained by the claimed method for the transfer of at least one alkyl radical. The invention further relates to a method for preparing the compounds to be used, by means of which said compounds can be produced in a simple, cost-effective and reproducible manner in good yield and high purity. In particular, ethereal solvents are to be dispensed with.

The main features of the invention are indicated in the below embodiments:

Embodiment 1 is a method for transferring at least one radical R to a compound according to the general formula E(X)$_q$ for preparing a compound according to the general formula $$E(X)_{q-p}R_p \qquad (II)$$

wherein

R is selected from the group consisting of a (C1-C10) alkyl radical, a partially or fully halogenated (C1-C10) alkyl radical, a (trialkylsilyl) alkyl radical R$^A$-Si(R$^B$)$_3$, a benzyl radical, a partially or fully substituted benzyl radical, a mononuclear or polynuclear arene, a partially or fully substituted mononuclear or polynuclear arene, a mononuclear or polynuclear heteroarene and a partially or fully substituted mononuclear or polynuclear heteroarene, wherein
R$^A$ is selected from the group consisting of a (C1-C6) alkylene radical and a partially or fully halogenated (C1-C6) alkylene radical,
R$^B$ radicals are selected independently of one another from the group consisting of a (C1-C10) alkyl radical, a partially or fully halogenated (C1-C10) alkyl radical and an O-R$^E$ alkyl ether radical,
wherein radicals R$^E$ are selected independently of one another from the group consisting of a (C1-C10) alkyl radical, a partially or fully halogenated (C1-C10) alkyl radical, a benzyl radical, a partially or fully substituted benzyl radical, a mononuclear or polynuclear arene, a partially or fully substituted mononuclear or polynuclear arene, a mononuclear or polynuclear heteroarene and a partially or fully substituted mononuclear or polynuclear heteroarene,
E is selected from the group consisting of aluminum, gallium, indium, thallium, germanium, tin, lead, antimony, bismuth, zinc, cadmium, mercury and phosphorus,
X=halogen,
q=2, 3 or 4,
and
p=1, 2, 3 or 4,
using a lithium alkyl aluminate according to the general formula Li[AlR$_4$] (I),
wherein
R is selected from the group consisting of a (C1-C10) alkyl radical, a partially or fully halogenated (C1-C10) alkyl radical, a (trialkylsilyl) alkyl radical R$^A$-Si(R$^B$)$_3$, a benzyl radical, a partially or fully substituted benzyl radical, a mononuclear or polynuclear arene, a partially or fully substituted mononuclear or polynuclear arene, a mononuclear or polynuclear heteroarene and a partially or fully substituted mononuclear or polynuclear heteroarene,
wherein
-R$^A$ is selected from the group consisting of a (C1-C6) alkylene radical and a partially or fully halogenated (C1-C6) alkylene radical,
-R$^B$ radicals are selected independently of one another from the group consisting of a (C1-C10) alkyl radical, a partially or fully halogenated (C1-C10) alkyl radical and an O-R$^E$ alkyl ether radical,
wherein radicals R$^E$ are selected independently of one another from the group consisting of a (C1-C10) alkyl radical, a partially or fully halogenated (C1-C10) alkyl radical, a benzyl radical, a partially or fully substituted benzyl radical, a mononuclear or polynuclear arene, a partially or fully substituted mononuclear or polynuclear arene, a mononuclear or polynuclear heteroarene and a partially or fully substituted mononuclear or polynuclear heteroarene,
comprising the steps of:
a) providing the lithium alkyl aluminate according to the general formula Li[AlR$_4$] (I), and
b) reacting E(X)$_q$ with the lithium alkyl aluminate Li[AlR$_4$] (I) in at least one aprotic solvent in a reaction vessel.
Embodiment 2 is the method according to embodiment 1, wherein R is selected from the group consisting of Me, Et, nPr, iPr, nBu, tBu, sBu, iBu, CH(Me)(iPr), CH(Me)(nPr), CH(Et)$_2$, CH(Et)(Me)$_2$, CH$_2$C$_6$H$_5$, C$_6$H$_5$, CH$_2$SiMe$_3$, CH$_2$SiEt$_3$, CH$_2$Si(Me)$_2$(OMe), CH$_2$Si(Et)$_2$(OEt), CH$_2$Si(Me)(tBu)(OMe), CH$_2$Si(tBu)(C$_6$H$_5$)(OtBu) and CH$_2$Si(iPr)$_2$(OiPr).

Embodiment 3 is the method a method according to embodiment 1, wherein X=F, Cl or Br.
Embodiment 4 is the method according to embodiment 1, wherein the reaction of E(X)$_q$ with the lithium alkyl aluminate Li[AlR$_4$] (I) comprises the steps of:
i) providing a solution of E(X)$_q$ in a first solvent,
ii) adding the lithium alkyl aluminate Li[AlR$_4$] (I),
wherein during and/or after the addition of Li[AlR$_4$] (I), a reaction of E(X)$_q$ with Li[AlR$_4$] (I) takes place.
Embodiment 5 is the method according to embodiment 4, wherein Li[AlR$_4$] (I) is added in a form suspended or dissolved in a second solvent.
Embodiment 6 is the method according to embodiment 5, wherein the second solvent is miscible with or identical to the first solvent.
Embodiment 7 is the method according to embodiment 6, wherein the first solvent and the second solvent are selected independently of one another from the group consisting of hydrocarbons, benzene and benzene derivatives.
Embodiment 8 is the method according to embodiment 1, wherein the reaction of E(X)$_q$ with the lithium alkyl aluminate Li[AlR$_4$] (I) is carried out at an internal temperature T$_w$ of the reaction vessel, the internal temperature Tw being between −50° C. and 100° C.
Embodiment 9 is the method according to embodiment 4, wherein an internal temperature T$_K$ of the reaction vessel during and/or after the addition of Li[AlR$_4$] (I) is between −60° C. and 50° C.
Embodiment 10 is the method according to embodiment 1, wherein the step comprising the reaction of E(X)$_q$ with Li[AlR$_4$] (I) is followed by a further step comprising an isolation of E(X)$_{q-p}$R$_p$ (II).
Embodiment 11 are compounds according to the general formula E(X)$_{q-p}$R$_p$ (II), obtainable according to the method in accordance with embodiment 1.
Embodiment 12 are compounds according to embodiment 11, wherein the compounds are isomerically pure.
Embodiment 13 is a method for preparing lithium alkyl aluminates according to the general formula $$Li[AlR_4] \qquad (I)$$

wherein
R is selected from the group consisting of a (C1-C10) alkyl radical, a partially or fully halogenated (C1-C10) alkyl radical, a (trialkylsilyl) alkyl radical R$^A$-Si(R$^B$)$_3$, a benzyl radical, a partially or fully substituted benzyl radical, a mononuclear or polynuclear arene, a partially or fully substituted mononuclear or polynuclear arene, a mononuclear or polynuclear heteroarene and a partially or fully substituted mononuclear or polynuclear heteroarene,
wherein
R$^A$ is selected from the group consisting of a (C1-C6) alkylene radical and a partially or fully halogenated (C1-C6) alkylene radical,
R$^B$ radicals are selected independently of one another from the group consisting of a (C1-C10) alkyl radical, a partially or fully halogenated (C1-C10) alkyl radical and an O-R$^E$ alkyl ether radical, wherein radicals R$^E$ are selected independently of one another from the group consisting of a (C1-C10) alkyl radical, a partially or fully halogenated (C1-C10) alkyl radical, a benzyl radical, a partially or fully substituted benzyl radical, a mononuclear or polynuclear arene, a partially or fully substituted mononuclear or polynuclear arene, a mononuclear or polynuclear heteroarene and a partially or fully substituted mononuclear or polynuclear heteroarene, comprising the step of:

Reacting LiAlH$_4$ with a compound according to the general formula RLi,
wherein
R is selected from the group consisting of a (C1-C10) alkyl radical, a partially or fully halogenated (C1-C10) alkyl radical, a (trialkylsilyl) alkyl radical R$^A$-Si(R$^B$)$_3$, a benzyl radical, a partially or fully substituted benzyl radical, a mononuclear or polynuclear arene, a partially or fully substituted mononuclear or polynuclear arene, a mononuclear or polynuclear heteroarene and a partially or fully substituted mononuclear or polynuclear heteroarene,
wherein
R$^A$ is selected from the group consisting of a (C1-C6) alkylene radical and a partially or fully halogenated (C1-C6) alkylene radical,
R$^B$ radicals are selected independently of one another from the group consisting of a (C1-C10) alkyl radical, a partially or fully halogenated (C1-C10) alkyl radical and an O-R$^E$ alkyl ether radical, wherein radicals R$^E$ are selected independently of one another from the group consisting of a (C1-C10) alkyl radical, a partially or fully halogenated (C1-C10) alkyl radical, a benzyl radical, a partially or fully substituted benzyl radical, a mononuclear or polynuclear arene, a partially or fully substituted mononuclear or polynuclear arene, a mononuclear or polynuclear heteroarene and a partially or fully substituted mononuclear or polynuclear heteroarene,
in at least one aprotic solvent in a reaction vessel,
wherein a molar ratio LiAlH$_4$: RLi is >0.25.

Embodiment 14 is the method according to embodiment 13, wherein R is selected from the group consisting of Me, Et, nPr, iPr, nBu, tBu, sBu, iBu, CH(Me)(iPr), CH(Me)(nPr), CH(Et)$_2$, CH(Et)(Me)$_2$, CH$_2$C$_6$H$_5$, C$_6$H$_5$, CH$_2$SiMe$_3$, CH$_2$SiEt$_3$, CH$_2$Si(Me)$_2$(OMe), CH$_2$Si(Et)$_2$(OEt), CH$_2$Si(Me)(tBu)(OMe), CH$_2$Si(tBu)(C$_6$H$_5$)(OtBu) and CH$_2$Si(iPr)$_2$(OiPr).

Embodiment 15 is the method according to embodiment 13, wherein the reaction of LiAlH$_4$ with compound RLi comprises the steps of:
i) providing a solution or a suspension of LiAlH$_4$ in a first solvent S1,
ii) adding the compound RLi,
wherein during and/or after the addition of RLi, a reaction of LiAlH$_4$ with the compound RLi takes place.

Embodiment 16 is the method according to embodiment 13, wherein the compound RLi is added in a form suspended or dissolved in a second solvent S2.

Embodiment 17 is the method according to embodiment 16, wherein the second solvent S2 is miscible with or identical to the first solvent S1.

Embodiment 18 is the method according to embodiment 16, wherein the first solvent S1 and the second solvent S2 are selected independently of one another from the group consisting of hydrocarbons, benzene and benzene derivatives.

Embodiment 19 is the method according to embodiment 13, wherein the reaction of LiAlH$_4$ with the compound RLi is carried out at an internal temperature T$_U$ of the reaction vessel, the internal temperature T$_U$ being between −30° C. and 100° C.

Embodiment 20 is the method according to embodiment 15, wherein an internal temperature T$_H$ of the reaction vessel during and/or after the addition of the compound RLi is between −40° C. and 80° C.

Embodiment 21 is the method according to embodiment 13, wherein the step comprising the reaction of LiAlH$_4$ with compound RLi is followed by a further step comprising the isolation of Li[AlR$_4$]:
i) as a solution, comprising Li[AlR$_4$] (I) and the at least one aprotic solvent,
or
ii) as a solid.

Embodiment 22 is the method according to embodiment 13, wherein isolation comprises a filtration step.

Embodiment 23 is a method for preparing compounds according to the general formula

(R)EH$_2$(III), using
a lithium alkyl aluminate according to the general formula Li[AlR$_4$] (I),
wherein
R is selected from the group consisting of a (C1-C10) alkyl radical, a partially or fully halogenated (C1-C10) alkyl radical, a (trialkylsilyl) alkyl radical R$^A$-Si(R$^B$)$_3$, a benzyl radical, a partially or fully substituted benzyl radical, a mononuclear or polynuclear arene, a partially or fully substituted mononuclear or polynuclear arene, a mononuclear or polynuclear heteroarene and a partially or fully substituted mononuclear or polynuclear heteroarene,
wherein
R$^A$ is selected from the group consisting of a (C1-C6) alkylene radical and a partially or fully halogenated (C1-C6) alkylene radical,
R$^B$ radicals are selected independently of one another from the group consisting of a (C1-C10) alkyl radical, a partially or fully halogenated (C1-C10) alkyl radical and an O-R$^E$ alkyl ether radical,
wherein radicals R$^E$ are selected independently of one another from the group consisting of a (C1-C10) alkyl radical, a partially or fully halogenated (C1-C10) alkyl radical, a benzyl radical, a partially or fully substituted benzyl radical, a mononuclear or polynuclear arene, a partially or fully substituted mononuclear or polynuclear arene, a mononuclear or polynuclear heteroarene and a partially or fully substituted mononuclear or polynuclear heteroarene,
comprising the steps of:
a) providing a solution of lithium alkyl aluminate according to the general formula Li[AlR$_4$] (I) in at least one aprotic solvent,
b) reacting the solution from step a) with a compound EX3 in a reaction vessel,
wherein
E is selected from the group consisting of phosphorus, antimony and bismuth
and
X=halogen,
and
c) adding a solution or a suspension comprising a hydridic reducing agent in an aprotic solvent Sz,
wherein
a molar ratio EX$_3$: Li[AlR$_4$] (I) is >4
and
a molar ratio EX$_3$: reducing agent is <1.

Embodiment 24 is the method according to embodiment 23, wherein the hydridic reducing agent is prepared in situ by reacting NaAlH$_4$ with a glycol ether, wherein a molar ratio NaAlH$_4$: glycol ether is 0.5.

Embodiment 25 is the method according to embodiment 24 wherein the glycol ether is selected from the group consisting of a monoethylene glycol monoether, a diethylene glycol monoether, a triethylene glycol monoether, a monopropylene glycol monoether, a dipropylene glycol monoether and a tripropylene glycol monoether.

Embodiment 26 is a compound in accordance with the general formula (R)EH$_2$(III), obtainable by the method according to embodiment 23.

Embodiments are the subject matter of claim 2, claims 5 to 13 or claims 19 to 27.

The object is achieved by lithium alkyl aluminates according to the general formula Li[AlR$_4$] (I). R is selected from the group consisting of a (C1-C10) alkyl radical, a partially or fully halogenated (C1-C10) alkyl radical, a (trialkylsilyl) alkyl radical $R^A$—Si($R^B$)$_3$, a benzyl radical, a partially or fully substituted benzyl radical, a mononuclear or polynuclear arene, a partially or fully substituted mononuclear or polynuclear arene, a mononuclear or polynuclear heteroarene and a partially or fully substituted mononuclear or polynuclear heteroarene. Here, $R^A$ is selected from the group consisting of a (C1-C6) alkylene radical and a partially or fully halogenated (C1-C6) alkylene radical. $R^B$ radicals are selected independently of one another from the group consisting of a (C1-C10) alkyl radical, a partially or fully halogenated (C1-C10) alkyl radical and an O—$R^E$ alkyl ether radical. Radicals $R^E$ are selected independently of one another from the group consisting of a (C1-C10) alkyl radical, a partially or fully halogenated (C1-C10) alkyl radical, a benzyl radical, a partially or fully substituted benzyl radical, a mononuclear or polynuclear arene, a partially or fully substituted mononuclear or polynuclear arene, a mononuclear or polynuclear heteroarene and a partially or fully substituted mononuclear or polynuclear heteroarene.

Li[AltBu$_4$] and Li[Al(CH$_2$SiMe$_3$)$_4$] are excluded. Thus, these compounds are therefore not claimed as such, with the subject matter of the invention being instead merely their use as a transfer reagent for the transfer of at least one radical R.

The claimed lithium alkyl aluminates of the Li[AlR$_4$] (I) type present as solids or liquids can be prepared selectively, simply, cost-effectively and reproducibly in good yields and purities, in particular based on the commercially available compounds LiAlH$_4$ and RLi. Consequently, they can also be produced on an industrial scale. Particularly advantageous is the use of Li[AlR$_4$] (I) as a transfer reagent for transferring at least one of the four radicals R to an element halide or metal halide. This is because, when using Li[AlR$_4$] (I) as the transfer reagent, it is advantageously possible to selectively transfer one, two, three or four radicals R. Therefore, the preparation of heteroleptic complexes is also possible when using Li[AlR$_4$] (I). In the context of the present invention, one speaks of the synthesis of a heteroleptic complex when only part of the halide anions of the element halide or metal halide used are replaced by one radical R in each case. Alternatively, some of the halide anions may have already been replaced by other ligands that are different from R prior to the reaction with Li[AlR$_4$] (I).

It is furthermore advantageous that in the case of a transfer of four radicals R based on one molar equivalent of Li[AlR$_4$] (I), the resulting salt load is significantly reduced as compared to when using an alkylation reagent, by means of which only one radical R can be transferred per molar equivalent. In general, only LiAlX$_4$ is obtained as a byproduct that can be separated in a relatively simple quantitative manner. In addition, compounds according to the general formula Li[AlR$_4$] (I) can be prepared in various non-ethereal organic solvents and exhibit good solubility in them, in particular in nonpolar solvents, such as, for example, the various isomers of pentane, hexane and decane. As a result, and with a view to a further reaction of Li[AlR$_4$] (I), it is excluded from the outset that the respective derived product, in particular an alkylation product or its derived products, are possibly contaminated with ether or oxygen traces. In particular with regard to an industrial application, the heat of reaction that is lower in comparison to reactions with common alkylation reagents is advantageous when using Li[AlR$_4$] (I) as a transfer reagent. As a result, not only are energy costs for cooling reduced, but also a more favorable process control under safety aspects is made possible.

Compounds according to the general formula Li[AlR$_4$] (I) can be further reacted and/or stored immediately after their isolation. As an alternative or in addition, the respective compound Li[AlR$_4$] (I) may be used to prepare a defined stock solution in a nonpolar solvent.

The claimed lithium alkyl aluminates according to the general formula Li[AlR$_4$] (I) are to be assessed as satisfactory from an (atom-)economic and ecological point of view.

The object is furthermore solved by the use of a lithium alkyl aluminate according to the general formula Li[AlR$_4$] (I) as a transfer reagent for transferring at least one radical R, in particular to a compound according to the general formula E(X)$_q$. R is selected from the group consisting of a (C1-C10) alkyl radical, a partially or fully halogenated (C1-C10) alkyl radical, a (trialkylsilyl) alkyl radical $R^A$—Si($R^B$)$_3$, a benzyl radical, a partially or fully substituted benzyl radical, a mononuclear or polynuclear arene, a partially or fully substituted mononuclear or polynuclear arene, a mononuclear or polynuclear heteroarene and a partially or fully substituted mononuclear or polynuclear heteroarene. $R^A$ is selected from the group consisting of a (C1-C6) alkylene radical and a partially or fully halogenated (C1-C6) alkylene radical. $R^B$ radicals are selected independently of one another from the group consisting of a (C1-C10) alkyl radical, a partially or fully halogenated (C1-C10) alkyl radical and an O—$R^E$ alkyl ether radical. Radicals $R^E$ are selected independently of one another from the group consisting of a (C1-C10) alkyl radical, a partially or fully halogenated (C1-C10) alkyl radical, a benzyl radical, a partially or fully substituted benzyl radical, a mononuclear or polynuclear arene, a partially or fully substituted mononuclear or polynuclear arene, a mononuclear or polynuclear heteroarene and a partially or fully substituted mononuclear or polynuclear heteroarene. E is selected from the group consisting of aluminum, gallium, indium, thallium, germanium, tin, lead, antimony, bismuth, zinc, cadmium, mercury and phosphorus. In addition, X=halogen and q=2, 3 or 4. Preferably, X=F, Cl or Br, in particular Cl.

When using a lithium alkyl aluminate according to the general formula Li[AlR$_4$] (I) as a transfer reagent, the method is a method for transferring at least one radical R to a compound according to the general formula E(X)$_q$ for preparing a compound according to the general formula E(X)$_{q-p}$R$_p$ (II) using a lithium alkyl aluminate according to the general formula Li[AlR$_4$] (I). R is selected from the group consisting of a (C1-C10) alkyl radical, a partially or fully halogenated (C1-C10) alkyl radical, a (trialkylsilyl) alkyl radical $R^A$—Si($R^B$)$_3$, a benzyl radical, a partially or fully substituted benzyl radical, a mononuclear or polynuclear arene, a partially or fully substituted mononuclear or polynuclear arene, a mononuclear or polynuclear heteroarene and a partially or fully substituted mononuclear or polynuclear heteroarene. $R^A$ is selected from the group consisting of a (C1-C6) alkylene radical and a partially or fully halogenated (C1-C6) alkylene radical. $R^B$ radicals are selected independently of one another from the group consisting of a (C1-C10) alkyl radical, a partially or fully halogenated (C1-C10) alkyl radical and an O—$R^E$ alkyl ether radical. Radicals $R^E$ are selected independently of one another from the group consisting of a (C1-C10) alkyl radical, a partially or fully halogenated (C1-C10) alkyl radical, a benzyl radical, a partially or fully substituted benzyl radical, a mononuclear or polynuclear arene, a partially or fully substituted mononuclear or polynuclear arene, a mononuclear or polynuclear heteroarene and a partially or fully substituted mononuclear or polynuclear heteroarene. E is selected from the group consisting of aluminum, gallium, indium, thallium, germanium, tin, lead, antimony, bismuth, zinc, cadmium, mercury and phosphorus. In addition, X=halogen, q=2, 3 or 4 and p=1, 2, 3 or 4. The method comprises the steps of:

a) providing the lithium alkyl aluminate
according to the general formula Li[AlR$_4$] (I),
and
b) reacting $E(X)_q$ with the lithium alkyl aluminate Li[AlR$_4$] (I)
in at least one aprotic solvent in a reaction vessel.

The aprotic solvent can also be a solvent mixture. Therefore, for example, the aprotic solvent may comprise two or more aprotic solvents.

The term reaction vessel is not limited to a volume, a material property, equipment or a shape.

Variable q is dependent on the oxidation number of the respective element E. For example, q=2 in the case of zinc, q=3 in the case of aluminum and q=4 in the case of tin.

Advantageously, one, two, three or four radicals R can be selectively transferred by the claimed method using Li[AlR$_4$] (I) as a transfer reagent. Therefore, with the above-described method using Li[AlR$_4$] (I) it is also possible to prepare heteroleptic complexes. In the context of the present invention, one speaks of the synthesis of a heteroleptic complex when only part of the halide anions of the element halide or metal halide $E(X)_q$ used are replaced by one radical R in each case. Alternatively, some of the halide anions may have already been replaced by other ligands different from R prior to reaction with Li[AlR$_4$] (I). Therefore, in addition to the selective preparation of compounds of the $E(X)_{q-p}R_p$ (II) type, the claimed method can also be applied to selectively prepare a plurality of compounds in which some of the halide anions are replaced by ligands other than R.

When using Li[AlR$_4$] (I) as a transfer reagent, it is particularly advantageous that, in particular in the case of a transfer of four radicals R based on one molar equivalent of transfer reagent, the resulting salt load is significantly reduced as compared to when using an alkylation reagent, by means of which only one radical R can be transferred per molar equivalent. This is because, in general, only LiAlX$_4$ is obtained as a by-product that can be separated in a relatively simple quantitative manner. Separation can be effected, for example, by means of a filtration step and/or a removal by distillation or condensation of a volatile target compound and/or a solvent or solvent mixture. Condensation may be followed by purification by distillation. In individual cases, the salt load instead consists of LiX. However, separation of LiX is also comparatively easily quantitatively possible by the selection of the aprotic solvent. For this purpose, a filtration step and/or separation of a volatile target compound and/or of a solvent or solvent mixture by means of distillation or condensation may likewise be provided. The latter may be followed by purification by distillation. Thus, purification of the respective alkylation product can generally be implemented in a particularly simple and cost-effective manner. This is advantageous in view of its preparation on an industrial scale and its further use. Another advantage is that ethereal solvents can be dispensed with completely when using Li[AlR$_4$] (I) as a transfer reagent. Li[AlR$_4$] (I) can be prepared in various non-ethereal organic solvents and exhibits good solubility in them, in particular in nonpolar solvents, such as, for example, the various isomers of pentane, hexane and decane. As a result, it is excluded from the outset that the respective alkylation product or its subsequent products are possibly contaminated with ether or oxygen traces. In particular with regard to an industrial application, the heat of reaction that is lower in comparison to reactions with common alkylation reagents is advantageous. As a result, not only are energy costs for cooling reduced, but also a more favorable process control is made possible under safety aspects.

The compounds according to the general formula $E(X)_{q-p}R_p$ (II) that can be prepared by the claimed method using Li[AlR$_4$] (I) are obtained in good to very good yields of, in some cases, >80% and in high purity, as set forth above.

In the simplest case, namely an in situ preparation of the respective alkylated product, the claimed method advantageously provides for only one reaction step for a further reaction that follows directly thereafter. Consequently, the desired end product may be advantageously prepared by means of one-pot synthesis.

Overall, the disadvantages of the prior art are overcome by the claimed use of a lithium alkyl aluminate according to the general formula Li[AlR$_4$] (I) as a transfer reagent or the claimed method for transferring at least one radical R to a compound according to the general formula $E(X)_q$ for preparing a compound according to the general formula $E(X)_{q-p}R_p$ (II) using a compound of the Li[AlR$_4$] (I) type. The claimed method is satisfactory from an (atom-)economic and ecological point of view.

One embodiment of the claimed use of Li[AlR$_4$] (I) or the claimed method provides for R selected from the group consisting of Me, Et, nPr, iPr, nBu, tBu, sBu, iBu, CH(Me)(iPr), CH(Me)(nPr), CH(Et)$_2$, CH(Et)(Me)$_2$, CH$_2$C$_6$H$_5$, C$_6$H$_5$, CH$_2$SiMe$_3$, CH$_2$SiEt$_3$, CH$_2$Si(Me)$_2$(OMe), CH$_2$Si(Et)$_2$(OEt), CH$_2$Si(Me)(tBu)(OMe), CH$_2$Si(tBu)(C$_6$H$_5$)(OtBu) and CH$_2$Si(iPr)$_2$(OiPr). The use of these compounds, e.g. of Li[AltBu$_4$] and Li[Al(CH$_2$SiMe$_3$)$_4$], is interesting in terms of preparation, also on an industrial scale, due to the fact that the alkyl radicals R are selectively transferable by them.

In a further embodiment of the claimed use of Li[AlR$_4$] (I) or the claimed method, for the starting material to be alkylated, i.e. the element halide or metal halide formula $E(X)_q$, it is provided that X=F, Cl or Br.

Another variant of the claimed use of Li[AlR$_4$] (I) or of the claimed method provides for the reaction of $E(X)_q$ with the lithium alkyl aluminate Li[AlR$_4$] (I) to comprise the steps of:
i) providing a solution or a suspension of $E(X)_q$ in a first solvent,
ii) adding the lithium alkyl aluminate Li[AlR$_4$] (I),
wherein during and/or after the addition of Li[AlR$_4$] (I), a reaction of $E(X)_q$ with Li[AlR$_4$] (I) takes place.

The first solvent may also be a solvent mixture.

In one embodiment of the claimed use of Li[AlR$_4$] (I) or the claimed method, a molar ratio $E(X)_q$:Li[AlR$_4$] (I) is ≥1:3. Therefore, the molar ratio $E(X)_q$:Li[AlR$_4$] (I) is at least ⅓, that is, one third.

The molar ratio $E(X)_q$:Li[AlR$_4$] (I) is selected, on the one hand, as a function of the number of radicals R to be transferred and, on the other hand, taking into account the element halide or metal halide $E(X)_q$ used in each case as reactant. In the presence of a molar equivalent of the lithium alkyl aluminate Li[AlR$_4$] (I), all four radicals R are in principle selectively transferable. Depending on the process and stoichiometry of the reactants $E(X)_q$ and Li[AlR$_4$] (I) used, one, two, three or four radicals R can be advantageously transferred selectively. For example, if PCl$_3$ is reacted using Li[AltBu$_4$] and if the molar ratio of these two reactants is 4:1, i.e. four, then four moles of PCl$_2$tBu are obtained. Single alkylation thus takes place. The situation is different if ZnCl$_2$ is reacted using Li[AltBu$_4$] and the molar ratio of the reactants is 1:0.5, i.e. two. In this case, double alkylation takes place so as to yield one mole of ZntBu$_2$. Yet another example shows the reaction of AlCl$_3$ with Li[AltBu$_4$] at a molar ratio of 1:3, i.e. one third. In this way, four moles of AltBu$_3$ are synthesized, wherein three moles of LiCl precipitate.

In one variant of the claimed use of Li[AlR$_4$] (I) or of the claimed method, it is provided that in step ii) Li[AlR$_4$] (I) is added in a form suspended or dissolved in a second solvent. Depending on the other reaction parameters, this can be advantageous for better control of the course of the reaction or of the exothermicity. The addition of the lithium alkyl aluminate Li[AlR$_4$] (I) as a solution or suspension in the second solvent takes place, for example, using a metering device, in particular by dropwise addition or injection. In the alternative or in addition, a shut-off valve and/or a stop valve can be provided in a supply line of the reaction vessel.

Another embodiment provides for the second solvent to be miscible with or identical to the first solvent. In the context of the present invention, two solvents are referred to as miscible if they are miscible at least during the respective reaction, that is, are not present as two phases.

In yet another embodiment of the claimed use of Li[AlR$_4$] (I) or the claimed method, $E(X)_q$ is provided or supplied as a solid. Then, Li[AlR$_4$] (I) is added as a solution or suspension in the second solvent, for example by dropwise addition or injection.

In an alternative embodiment of the claimed use of Li[AlR$_4$] (I) or the claimed method, Li[AlR$_4$] (I) is added as a solid in step ii), for example via a funnel or a funnel-like device.

A further variant of the claimed use of Li[AlR$_4$] (I) or the claimed method provides for providing or supplying, in a first step, a solution or suspension of the lithium alkyl aluminate Li[AlR$_4$] (I) in a first solvent for the reaction of $E(X)_q$ with the lithium alkyl aluminate Li[AlR$_4$] (I). In a second step, $E(X)_q$ is added as a solid or as a suspension or solution in a second solvent. The first solvent and the second solvent are miscible, but they may also be identical.

Depending on the choice of solvent or solvent mixture and the other reaction conditions, such as, for example, the form of addition of Li[AlR$_4$] (I), i.e. as a substance or solid or dissolved in the second solvent, rate of addition of Li[AlR$_4$] (I), stirring speed, internal temperature of the reaction vessel, the reaction of $E(X)_q$ with Li[AlR$_4$] (I) takes place already during and/or after the addition of Li[AlR$_4$] (I).

In another embodiment of the claimed use of Li[AlR$_4$] (I) or the claimed method, the first solvent and the second solvent are selected independently of one another from the group consisting of hydrocarbons, benzene and benzene derivatives. For example, the first solvent and the second solvent are selected independently of one another from the group consisting of n-pentane, n-hexane, n-heptane, n-octane, n-nonane, n-decane, n-undecane, n-dodecane, cyclopentane, cyclohexane, cycloheptane, 1-pentene, 1-hexene, 1-heptene, 1-octene, 1-nonene, 1-decene, 1-undecene, 1-dodecene, cyclohexene, benzene, toluene, xylene and isomers thereof. It is also possible to use mixtures of two or more solvents, in particular mixtures of aliphatic hydrocarbons. Preferred are n-pentane, n-hexane, i-hexane and n-decane and possible mixtures. The use of a relatively high-boiling solvent, for example n-decane, or a relatively high-boiling solvent mixture is particularly advantageous if the particular target compound of the $E(X)_{q-p}R_p$ (II) type is separable by distillation. Because of this, the separation of the salt load formed in the reaction of Li[AlR$_4$] (I) with $E(X)_q$ is possible in a particularly simple and quantitative manner since it remains in the reaction vessel. In addition, the reactant Li[AlR$_4$] (I) is readily soluble in solvents, such as n-decane.

In another embodiment of the claimed use of Li[AlR$_4$] (I) or the claimed method, the reaction of $E(X)_q$ with the lithium alkyl aluminate Li[AlR$_4$] (I) is carried out at an internal temperature $T_W$ of the reaction vessel. In this case, the internal temperature $T_W$ is between −50° C. and 100° C. Due to the exothermicity of the reaction, it may be advantageous to select the rate of addition of Li[AlR$_4$] (I) and/or the internal temperature $T_W$ of the reaction vessel to be relatively low. In the alternative or in addition, it may be provided for a solution or suspension of Li[AlR$_4$] (I) in the second solvent or solvent mixture to be added. The respective procedure should be selected taking into account the other reaction parameters, such as the $E(X)_q$ concentration and the solvent or solvent mixture.

An internal temperature of the reaction vessel may be determined using a temperature sensor or a plurality of temperature sensors for one or more regions of the reaction vessel. At least one temperature sensor is provided for determining the internal temperature $T_W$, which generally corresponds to an average temperature $T_{D1}$ of the reaction mixture.

In another variant of the claimed use of Li[AlR$_4$] (I) or the claimed method, the internal temperature $T_W$ of the reaction vessel during the reaction of $E(X)_q$ with Li[AlR$_4$] (I) is between −40° C. and 80° C. In yet another variant, the internal temperature $T_W$ of the reaction vessel during the reaction of $E(X)_q$ with Li[AlR$_4$] (I) is between −30° C. and 60° C.

In a further embodiment of the claimed use of Li[AlR$_4$] (I) or the claimed method, the internal temperature $T_W$ of the reaction vessel is regulated and/or controlled using a heat transfer medium $W_W$. For this purpose, a cryostat can be used, for example, which contains a heat transfer medium, which ideally can function both as a coolant and as a heating medium. The use of the heat transfer medium $W_W$ allows for any deviations of the internal temperature $T_W$ from a setpoint value $T_{S1}$ defined for the reaction of $E(X)_q$ with Li[AlR$_4$] (I) to be largely absorbed or compensated. A constant internal temperature $T_W$ is almost impossible to implement due to the usual device deviations. However, by using the heat transfer medium $W_W$, the reaction of $E(X)_q$ with Li[AlR$_4$] (I) can be carried out at least within a preselected temperature range or within multiple preselected temperature ranges. For example, depending on the remaining reaction parameters, it may be advantageous to provide a temperature program for even better control of the course of the reaction or the exothermic reaction. In this case, for example, a lower temperature or a lower temperature range can be selected during a first phase of adding Li[AlR$_4$](I) than in a second phase of adding Li[AlR$_4$] (I). It is also possible to provide more than two phases of the addition and thus more than two preselected temperatures or temperature ranges. Depending on the choice of the other reaction conditions, such as, for example, the $E(X)_q$ concentration and the solvent or solvent mixture, it may be favorable during and/or after the addition of Li[AlR$_4$] (I) to decrease, possibly even stepwise, the internal temperature $T_W$ of the reaction vessel using the heat transfer medium $W_W$. This may possibly ensure that the reaction of $E(X)_q$ with Li[AlR$_4$] (I) is carried out more slowly and thus in a more controlled manner, in particular as regards the heat of reaction. Following a decrease in internal temperature $T_W$ of the reaction vessel, a possibly even stepwise increase in internal temperature $T_W$ may be provided for so as to complete the reaction of $E(X)_q$ with Li[AlR$_4$] (I).

A further embodiment of the claimed use of Li[AlR$_4$] (I) or the claimed method provides for an internal temperature $T_K$ of the reaction vessel to be between −60° C. and 50° C. during and/or after the addition of Li[AlR$_4$] (I). In a further variant of the method, the internal temperature $T_K$ of the reaction vessel during and/or after the addition of Li[AlR$_4$] (I) is between −50° C. and 50° C. In yet another embodiment of the method, the internal temperature $T_K$ of the reaction vessel during and/or after the addition of Li[AlR$_4$] (I) is between −40° C. and 50° C. At least one temperature sensor is provided for determining the internal temperature $T_K$, which generally corresponds to an average temperature $T_{D2}$ of the reaction mixture. The temperature sensor may be identical to that for determining the internal temperature $T_W$.

In a further embodiment of the claimed use of Li[AlR$_4$] (I) or the claimed method, the internal temperature $T_K$ of the reaction vessel is regulated and/or controlled using a heat transfer medium $W_K$. For this purpose, a cryostat can be used, for example, which contains a heat transfer medium, which ideally can function both as a coolant and as a heating medium. The use of the heat transfer medium $W_K$ allows deviations of the internal temperature $T_K$ from a setpoint value $T_{S2}$ defined for the time during and/or after the addition of Li[AlR$_4$] (I) to be largely absorbed or compensated. A constant internal temperature $T_C$ is almost impossible to implement due to the usual device deviations. However, by using the heat transfer medium $W_W$, the reaction of $E(X)_q$ with Li[AlR$_4$] (I) can be carried out at least within a preselected temperature range or within multiple preselected temperature ranges. For example, depending on the remaining reaction parameters, it may be advantageous to provide a temperature program for even better control of the course of the reaction or the exothermic reaction. In this case, for example, a lower temperature or a lower temperature range can be selected during a first phase of the addition of Li[AlR$_4$] (I) than in a second phase of the addition of Li[AlR$_4$] (I). It is also possible to provide more than two phases of the addition and thus more than two preselected temperatures or temperature ranges.

In another embodiment of the claimed use of Li[AlR$_4$] (I) or the claimed method, a further step is carried out after the step comprising the reaction of $E(X)_q$ with Li[AlR$_4$] (I). The further step comprises isolating $E(X)_{q-p}R_p$ (II). If the compound $E(X)_{q-p}R_p$ (II) in solution in each case is not to be subjected directly to a further reaction, but rather isolated and then stored and/or further used, its isolation may comprise one or more steps. In one variant of the method, the isolation comprises a filtration step. Several filtration steps can also be provided, if necessary one or more filtrations over a cleaning medium, e.g. activated carbon or silica, e.g. Celite®. The filter cake comprising the LiAlX$_4$ load or LiX, may be washed with a small amount of a relatively volatile solvent, such as e.g. n-pentane, n-hexane or i-hexane in order to extract any product possibly contained in the LiAlX$_4$ load or LiX load. Isolation may comprise further method steps, such as, for example: the reduction of the volume of the mother liquor, i.e. concentration, for example by means of "bulb to bulb"; the addition of a solvent and/or a solvent exchange in order to achieve precipitation of the product out of the mother liquor and/or to remove impurities and/or reactants; washing and drying including freeze-drying of the product; condensation; distillation; and/or sublimation.

The object is also achieved by compounds according to the general formula $E(X)_{q-p}R_p$ (II), obtainable by a method for transferring at least one radical R to a compound according to the general formula $E(X)_q$, using a lithium alkyl aluminate according to the general formula Li[AlR$_4$] (I), according to any one of the above described embodiments.

R is selected from the group consisting of a (C1-C10) alkyl radical, a partially or fully halogenated (C1-C10) alkyl radical, a (trialkylsilyl) alkyl radical $R^A$—Si(R$^B$)$_3$, a benzyl radical, a partially or fully substituted benzyl radical, a mononuclear or polynuclear arene, a partially or fully substituted mononuclear or polynuclear arene, a mononuclear or polynuclear heteroarene and a partially or fully substituted mononuclear or polynuclear heteroarene. $R^A$ is selected from the group consisting of a (C1-C6) alkylene radical and a partially or fully halogenated (C1-C6) alkylene radical. $R^B$ radicals are selected independently of one another from the group consisting of a (C1-C10) alkyl radical, a partially or fully halogenated (C1-C10) alkyl radical and an O—R$^E$ alkyl ether radical. Radicals R$^E$ are selected independently of one another from the group consisting of a (C1-C10) alkyl radical, a partially or fully halogenated (C1-C10) alkyl radical, a benzyl radical, a partially or fully substituted benzyl radical, a mononuclear or polynuclear arene, a partially or fully substituted mononuclear or polynuclear arene, a mononuclear or polynuclear heteroarene and a partially or fully substituted mononuclear or polynuclear heteroarene. E is selected from the group consisting of aluminum, gallium, indium, thallium, germanium, tin, lead, antimony, bismuth, zinc, cadmium, mercury and phosphorus. In addition, X=halogen, in particular X=F, Cl or Br, q=2, 3 or 4 and p=1, 2, 3 or 4.

It is particularly advantageous that the compounds of $E(X)_{q-p}R_p$ (II) obtainable by the method described above are obtained relatively purely without the need for complex purification. This is because the LiAlX$_4$ load usually obtained as the sole by-product during preparation can be separated off in a relatively simple quantitative manner. Separation can be effected, for example, by means of a filtration step and/or a removal by distillation or condensation of a volatile target compound and/or a solvent or solvent mixture. Condensation may be followed by purification by distillation. In individual cases, the salt load instead consists of LiX. However, separation of LiX is also comparatively easily quantitatively possible by the selection of the aprotic solvent. For this purpose, a filtration step and/or separation of a volatile target compound and/or of a solvent or solvent mixture by means of distillation or condensation may likewise be provided. The latter may be followed by purification by distillation. Thus, purification of the compound of the $E(X)_{q-p}R_p$(II) type obtained in each case can generally be carried out in a particularly simple and cost-effective manner. This is advantageous in view of its preparation on an industrial scale and its further use. Another advantage is that ethereal solvents can be dispensed with completely when using Li[AlR$_4$] (I) as a transfer reagent. Li[AlR$_4$] (I) can be prepared in various non-ethereal organic solvents and exhibits good solubility in them, in particular in nonpolar solvents, such as, for example, the various isomers of pentane, hexane and decane. As a result, it is excluded from the outset that the respective alkylation product $E(X)_{q-p}R_p$ (II) or its subsequent products are possibly contaminated with ether or oxygen traces.

Moreover, advantageously one, two, three or four radicals R are selectively transferable to a compound according to the general formula $E(X)_q$ by the method described above using a lithium alkyl aluminate according to the general formula Li[AlR$_4$] (I) as a transfer reagent. Therefore, heteroleptic complexes of the $E(X)_{q-p}R_p$ (II) type are also obtainable with this method.

When using Li[AlR$_4$] (I) as a transfer reagent, it is particularly advantageous that, in particular in the case of a transfer of four radicals R based on one molar equivalent of transfer reagent, the resulting salt load is significantly reduced as compared to when using an alkylation reagent, by means of which only one radical R can be transferred per molar equivalent. The heat of reaction that is lower in comparison to reactions with common alkylation reagents is advantageous in particular with regard to an industrial preparation of compounds of the $E(X)_{q-p}R_p$ (II) type according to an embodiment of the method described above for transferring at least one radical R to a compound according to the general formula $E(X)_q$.

Overall, the compounds of the $E(X)_{q-p}R_p$ (II) type obtainable by the method described above are satisfactory from an economic and ecological point of view.

The compounds obtainable in this manner include, for example: AltBu$_3$, Al(CH$_2$SiMe$_3$)$_3$, GatBu$_3$, Ga(CH$_2$SiMe$_3$)$_3$, IntBu$_3$, In(CH$_2$SiMe$_3$)$_3$, TltBu$_3$, Tl(CH$_2$SiMe$_3$)$_3$, GeCl$_2$tBu$_2$, GeCl$_2$(CH$_2$SiMe$_3$)$_2$, SnCl$_3$tBu, SnCl$_2$tBu$_2$, SnCltBu$_3$, SntBu$_4$, Sn(CH$_2$SiMe$_3$)$_4$, PbCl$_3$tBu, SbCl$_2$tBu, SbCltBu$_2$, SbtBu$_3$, BitBu$_3$, ZntBu$_2$, CdtBu$_2$, HgtBu$_2$, PCl$_2$tBu, PCltBu$_2$ and PtBu$_3$.

In one embodiment of the compounds according to the general formula $E(X)_{q-p}R_p$ (II), the compounds are present in isomerically pure form. The term isomerically pure as used herein means that the desired isomer is present in an amount of ≥90%, preferably ≥95%, particularly preferably ≥99%. Isomer purity is determined, for example, by means of nuclear magnetic resonance spectroscopy.

In another variant of the compounds according to the general formula $E(X)_{q-p}R_p$ (II), the compound AltBu$_3$ is present in isomerically pure form. It is known that AltBu$_3$ tends to isomerize to Al(iBu)$_x$(tBu)$_{3-x}$, where x=1, 2 or 3. By means of the method described above, AltBu$_3$ is advantageously obtainable in particularly pure form, namely even in the form of colorless crystals, and in reproducible form. In contrast, the compound AltBu$_3$ prepared by a method known from the literature is frequently described as a colorless liquid. In the present case, even crystals suitable for single crystal structure analysis were obtained. Because a phase transition occurred during the measurement, the quality of the data set is such that it can be used only as proof of structure, but not to discuss structure parameters. However, the structure has already been described in the literature. In the product AltBu$_3$ obtained by the above-described method, the known isomerization to AliButBu$_2$ and subsequent products is not observed. The product is isomerically pure within the meaning of the above definition even after several months. Moreover, the >80% yield is satisfactory also with a view to an industrial application of this compound.

Compounds according to the general formula $E(X)_{q-p}R_p$ (II) can be obtained selectively, simply and inexpensively in accordance with any one of the above-described embodiments of the method. In addition to high isomer purity, they have a comparatively high purity with respect to inorganic salts and oxygen. The latter is attributable, inter alia, to the fact that—unlike synthesis rules known from the literature—ethereal solvents are dispensed with both in the preparation of the reactants Li[AlR$_4$] (I) and also during preparation of compounds of the $E(X)_{q-p}R_p$ (II) type. Thus, the compounds of the $E(X)_{q-p}R_p$ (II) type obtainable by the method described above are also suitable as reactants for the preparation of precursor compounds, e.g. for a vapor phase epitaxy method or a vapor deposition method.

The object is moreover also achieved by the use of a compound $E(X)_2R$ for the preparation of a compound according to the general formula $(R)EH_2$ (III). The compound $E(X)_2R$ to be used is obtained or obtainable by a method for transferring at least one radical R to a compound according to the general formula $E(X)_q$, wherein X=halogen, in particular X=F, Cl or Br, and q=2, 3 or 4, using a lithium alkyl aluminate according to the general formula Li[AlR$_4$](I), according to any one of the above-described embodiments. R is selected from the group consisting of a (C1-C10) alkyl radical, a partially or fully halogenated (C1-C10) alkyl radical, a (trialkylsilyl) alkyl radical $R^A$—Si($R^B$)$_3$, a benzyl radical, a partially or fully substituted benzyl radical, a mononuclear or polynuclear arene, a partially or fully substituted mononuclear or polynuclear arene, a mononuclear or polynuclear heteroarene and a partially or fully substituted mononuclear or polynuclear heteroarene. $R^A$ is selected from the group consisting of a (C1-C6) alkylene radical and a partially or fully halogenated (C1-C6) alkylene radical. $R^B$ radicals are selected independently of one another from the group consisting of a (C1-C10) alkyl radical, a partially or fully halogenated (C1-C10) alkyl radical and an O—$R^E$ alkyl ether radical. Radicals $R^E$ are selected independently of one another from the group consisting of a (C1-C10) alkyl radical, a partially or fully halogenated (C1-C10) alkyl radical, a benzyl radical, a partially or fully substituted benzyl radical, a mononuclear or polynuclear arene, a partially or fully substituted mononuclear or polynuclear arene, a mononuclear or polynuclear heteroarene and a partially or fully substituted mononuclear or polynuclear heteroarene. E is selected from the group consisting of phosphorus, antimony and bismuth.

The above-mentioned use of a compound $E(X)_2R$ for preparing a compound according to the general formula $(R)EH_2$ (III) is a method for preparing a compound according to the general formula $(R)EH_2$ (III) using a compound according to the general $E(X)_2R$. The compound $E(X)_2R$ to be used is obtained or obtainable by a method for transferring at least one radical R to a compound according to the general formula $E(X)_q$, wherein X=halogen, in particular X=F, Cl or Br, and q=2, 3 or 4, using a lithium alkyl aluminate according to the general formula Li[AlR$_4$] (I), according to any one of the above-described embodiments. R is selected from the group consisting of a (C1-C10) alkyl radical, a partially or fully halogenated (C1-C10) alkyl radical, a (trialkylsilyl) alkyl radical $R^A$—Si($R^B$)$_3$, a benzyl radical, a partially or fully substituted benzyl radical, a mononuclear or polynuclear arene, a partially or fully substituted mononuclear or polynuclear arene, a mononuclear or polynuclear heteroarene and a partially or fully substituted mononuclear or polynuclear heteroarene. $R^A$ is selected from the group consisting of a (C1-C6) alkylene radical and a partially or fully halogenated (C1-C6) alkylene radical. $R^B$ radicals are selected independently of one another from the group consisting of a (C1-C10) alkyl radical, a partially or fully halogenated (C1-C10) alkyl radical and an O—$R^E$ alkyl ether radical. Radicals $R^E$ are selected independently of one another from the group consisting of a (C1-C10) alkyl radical, a partially or fully halogenated (C1-C10) alkyl radical, a benzyl radical, a partially or fully substituted benzyl radical, a mononuclear or polynuclear arene, a partially or fully substituted mononuclear or polynuclear arene, a mononuclear or polynuclear heteroarene and a partially or fully substituted mononuclear or polynuclear heteroarene. E is selected from the group consisting of phosphorus, antimony and bismuth.

The method comprises the steps of:
a) providing the compound $E(X)_2R$,
and
b) reacting $E(X)_2R$ with a hydridic reducing agent in at least one aprotic solvent $S_x$ in a reaction vessel.

The term reaction vessel is not limited to a volume, a material property, equipment or a shape.

The compounds $E(X)_2R$ to be used in the claimed method are obtainable selectively, simply and inexpensively by means of the method described above. They have a comparatively high purity with respect to inorganic salts and oxygen. The latter is attributable, inter alia, to the fact that—unlike synthesis rules known from the literature—ethereal solvents are dispensed with both in the preparation of the reactants $Li[AlR_4]$ (I) and also during preparation of compounds of the $E(X)_2R$ type. Thus, the compounds of the $E(X)_2R$ type obtainable by the method described above are also suitable as reactants for preparing compounds according to the general formula $(R)EH_2$ (III) which have a comparatively high purity. With the method described here for the preparation of a compound according to the general formula $(R)EH_2$ (III), for example $tBuPH_2$ (TBP) is obtainable in a particularly simple manner selectively and in high purity.

In one embodiment of the claimed method, the compound $E(X)_2R$ is provided or supplied in step a) as a solution in an aprotic solvent $S_R$ or as a solid in the reaction vessel. In step b), $E(X)_2R$ is reacted with the hydridic reducing agent, said reaction comprising adding a solution or suspension of the hydridic reducing agent in the aprotic solvent $S_X$ to the compound $E(X)_2R$ that was provided as a solution in the aprotic solvent $S_R$ or as a solid. The solution or suspension of the hydridic reducing agent can be added, for example, dropwise or by injection.

In a further embodiment of the claimed method, solvent $S_R$ and solvent $S_X$ are selected independently of one another from the group consisting of hydrocarbons, benzene and benzene derivatives. For example, solvent $S_R$ and solvent $S_X$ are selected independently of one another from the group consisting of n-pentane, n-hexane, n-heptane, n-octane, n-nonane, n-decane, n-undecane, n-dodecane, cyclopentane, cyclohexane, cycloheptane, 1-pentene, 1-hexene, 1-heptene, 1-octene, 1-nonene, 1-decene, 1-undecene, 1-dodecene, cyclohexene, benzene, toluene, xylene and isomers thereof. It is also possible to use mixtures of two or more solvents, in particular mixtures of aliphatic hydrocarbons. Preferred are n-pentane, n-hexane, i-hexane and n-decane and possible mixtures.

Another embodiment of the claimed method provides for the solvent $S_R$ to be miscible with or identical to the solvent $S_X$.

A molar ratio $E(X)_2R$:hydridic reducing agent is chosen such that the two halide anions $X^-$ are replaced by two hydride ions $H^-$. The molar ratio $E(X)_2R$:hydridic reducing agent is preferably ≤1.

In one embodiment of the claimed method for preparing a compound according to the general formula $(R)EH_2$ (III), the hydridic reducing agent is prepared in situ by a reaction of $NaAlH_4$ with a glycol ether. Here, a molar ratio $NaAlH_4$: glycol ether is 1:2, i.e. 0.5.

The phrase "prepared in situ" as used in the present invention means that the reactants required for the synthesis of a compound to be prepared in this way are reacted in a suitable stoichiometry in a solvent or solvent mixture and the resulting product is not isolated. Rather, the solution or suspension comprising the compound produced in situ is generally re-used directly, i.e. without further purification.

In a further embodiment of the method for preparing a compound according to the general formula $(R)EH_2$ (III), the glycol ether is selected from the group consisting of a monoethylene glycol monoether, a diethylene glycol monoether, a triethylene glycol monoether, a monopropylene glycol monoether, a dipropylene glycol monoether and a tripropylene glycol monoether. A monoethylene glycol monoether or a diethylene glycol monoether is preferably used, particularly preferably ethylene glycol butyl ether or diethylene glycol monobutyl ether. A diethylene glycol monoether, in particular those in which the terminal alkyl group comprises at least four carbon atoms, is advantageous in its comparatively better solubility in aliphatic hydrocarbons. The latter are used in the method claimed herein preferably as solvents, especially n-pentane, n-hexane, n-heptane, n-octane, n-nonane, n-decane, n-undecane and n-dodecane and isomers thereof. Furthermore, cyclopentane, cyclohexane, cycloheptane, 1-pentene, 1-hexene, 1-heptene, 1-octene, 1-nonene, 1-decene, 1-undecene, 1-dodecene, cyclohexene, benzene, toluene and xylene and isomers thereof also find.

In another variant of the method for preparing a compound according to the general formula $(R)EH_2$ (III), the hydridic reducing agent is sodium bis(2-methoxyethoxy)-aluminum dihydride or lithium aluminum hydride. It is therefore a commercially available hydridic reducing agent. Sodium bis(2-methoxyethoxy)-aluminum dihydride is a dihydrido dialkoxy aluminate and is also known as Synhydrid, Red-Al® and Vitrid®. This reducing agent is commercially available in the form of a viscous, toluenic solution, an approximate weight fraction of >60 wt. % being stated.

The object is further achieved by the use of a compound $AlR_3$ as a precursor compound for preparing an aluminum layer or a layer containing aluminum on a surface of a substrate. The compound $AlR_3$ to be used is obtained or obtainable by a method for transferring at least one radical R to a compound according to the general formula $E(X)_q$, wherein X=halogen, in particular X=F, Cl or Br, and q=2, 3 or 4, using a lithium alkyl aluminate according to the general formula $Li[AlR_4]$ (I), according to any one of the above-described embodiments. R is selected from the group consisting of a (C1-C10) alkyl radical, a partially or fully halogenated (C1-C10) alkyl radical, a (trialkylsilyl) alkyl radical $R^A$—$Si(R^B)_3$, a benzyl radical, a partially or fully substituted benzyl radical, a mononuclear or polynuclear arene, a partially or fully substituted mononuclear or polynuclear arene, a mononuclear or polynuclear heteroarene and a partially or fully substituted mononuclear or polynuclear heteroarene. $R^A$ is selected from the group consisting of a (C1-C6) alkylene radical and a partially or fully halogenated (C1-C6) alkylene radical. $R^B$ radicals are selected independently of one another from the group consisting of a (C1-C10) alkyl radical, a partially or fully halogenated (C1-C10) alkyl radical and an O—$R^E$ alkyl ether radical. Radicals $R^E$ are selected independently of one another from the group consisting of a (C1-C10) alkyl radical, a partially or fully halogenated (C1-C10) alkyl radical, a benzyl radical, a partially or fully substituted benzyl radical, a mononuclear or polynuclear arene, a partially or fully substituted mononuclear or polynuclear arene, a mononuclear or polynuclear heteroarene and a partially or fully substituted mononuclear or polynuclear heteroarene.

The aforementioned use of a compound $AlR_3$ as a precursor compound is a method for preparing an aluminum layer or a layer containing aluminum on a surface of a substrate using a compound $AlR_3$. The compound $AlR_3$ to be used is obtained or obtainable by a method for transferring at least one radical R to a compound according to the general formula $E(X)_q$, wherein X=halogen, in particular X=F, Cl or Br, and q=2, 3 or 4, using a lithium alkyl aluminate according to the general formula $Li[AlR_4]$ (I), according to any one of the above-described embodiments. R is selected from the group consisting of a (C1-C10) alkyl radical, a partially or fully halogenated (C1-C10) alkyl radical, a (trialkylsilyl) alkyl radical $R^A$—$Si(R^B)_3$, a benzyl radical, a partially or fully substituted benzyl radical, a mononuclear or polynuclear arene, a partially or fully substituted mononuclear or polynuclear arene, a mononuclear or polynuclear heteroarene and a partially or fully substituted mononuclear or polynuclear heteroarene. $R^A$ is selected from the group consisting of a (C1-C6) alkylene radical and a partially or fully halogenated (C1-C6) alkylene radical. $R^B$ radicals are selected independently of one another from the group consisting of a (C1-C10) alkyl radical, a partially or fully halogenated (C1-C10) alkyl radical and an O—$R^E$ alkyl ether radical. Radicals $R^E$ are selected independently of one another from the group consisting of a (C1-C10) alkyl radical, a partially or fully halogenated (C1-C10) alkyl radical, a benzyl radical, a partially or fully substituted benzyl radical, a mononuclear or polynuclear arene, a partially or fully substituted mononuclear or polynuclear arene, a mononuclear or polynuclear heteroarene and a partially or fully substituted mononuclear or polynuclear heteroarene. The method comprises the steps of:
a) providing the compound $AlR_3$
and
b) depositing the aluminum layer or the layer containing aluminum on the surface of the substrate.

The term "layer" is synonymous with the expression "film" and does not make any statement regarding the layer thickness or the film thickness. Corundum foils or thin metallic foils can, for example, be used as the substrate. The substrate itself can be part of a component. Deposition of the aluminum layer or the layer containing aluminum can be effected by means of a vapor phase epitaxy method or a vapor deposition method,
such as atomic layer deposition or chemical vapor deposition.

Owing to their high purity, the compounds $AlR_3$ used are particularly well suited as precursors for preparing high-quality aluminum layers or layers containing aluminum. In particular, they are free of contamination by inorganic salts and oxygen, which are disadvantageous for the coating process and thus for the performance of the coated substrates. The absence of oxygen traces is attributable, inter alia, to the fact that—unlike synthesis rules known from the literature—ethereal solvents are dispensed with both in the preparation of the reactants $Li[AlR_4]$ (I) and also during preparation of compounds $AlR_3$.

In one embodiment of the use of a compound $AlR_3$ as a precursor compound or the method for preparing an aluminum layer or a layer containing aluminum on a surface of a substrate using a compound $AlR_3$, the substrate is a wafer. The wafer may comprise silicon, silicon carbide, germanium, gallium arsenide, indium phosphide, a glass, such as $SiO_2$, and/or a plastic, such as silicone, or consist entirely of one or more of said materials. The wafer can also have one or more wafer layers, each having one surface. The preparation of the aluminum layer or the layer containing aluminum may be provided on the surface of one or more wafer layers.

The object is further achieved by a substrate having an aluminum layer or a layer containing aluminum on one surface, wherein the aluminum layer or the layer containing aluminum can be produced by using a compound $AlR_3$, obtained or obtainable by a method for transferring at least one radical R to a compound according to the general formula $E(X)_q$, wherein X=halogen, in particular X=F, Cl or Br, and q=2, 3 or 4, using a lithium alkyl aluminate according to the general formula $Li[AlR_4]$ (I), according to any one of the above-described embodiments. R is selected from the group consisting of a (C1-C10) alkyl radical, a partially or fully halogenated (C1-C10) alkyl radical, a (trialkylsilyl) alkyl radical $R^A$—$Si(R^B)_3$, a benzyl radical, a partially or fully substituted benzyl radical, a mononuclear or polynuclear arene, a partially or fully substituted mononuclear or polynuclear arene, a mononuclear or polynuclear heteroarene and a partially or fully substituted mononuclear or polynuclear heteroarene. $R^A$ is selected from the group consisting of a (C1-C6) alkylene radical and a partially or fully halogenated (C1-C6) alkylene radical. $R^B$ radicals are selected independently of one another from the group consisting of a (C1-C10) alkyl radical, a partially or fully halogenated (C1-C10) alkyl radical and an O—$R^E$ alkyl ether radical. Radicals $R^E$ are selected independently of one another from the group consisting of a (C1-C10) alkyl radical, a partially or fully halogenated (C1-C10) alkyl radical, a benzyl radical, a partially or fully substituted benzyl radical, a mononuclear or polynuclear arene, a partially or fully substituted mononuclear or polynuclear arene, a mononuclear or polynuclear heteroarene and a partially or fully substituted mononuclear or polynuclear heteroarene.

The term "layer" is synonymous with the expression "film" and does not make any statement regarding the layer thickness or the film thickness. Corundum foils or thin metallic foils can, for example, be used as the substrate. The substrate itself can be part of a component. Deposition of the aluminum layer or the layer containing aluminum may have been effected by means of a vapor phase epitaxy method or a vapor deposition method,
such as atomic layer deposition or chemical vapor deposition.

Owing to their high purity, the compounds $AlR_3$ used are particularly well suited as precursors for preparing high-quality aluminum layers and layers containing aluminum. In particular, they are free of contamination by inorganic salts and oxygen, which are disadvantageous for the coating process and thus for the performance of the coated substrates. The absence of oxygen traces is attributable, inter alia, to the fact that—unlike synthesis rules known from the literature—ethereal solvents are dispensed with both in the preparation of the reactants $Li[AlR_4]$ (I) and also during preparation of compounds $AlR_3$.

In one embodiment, the substrate is a wafer. The wafer may comprise silicon, silicon carbide, germanium, gallium arsenide, indium phosphide, a glass, such as $SiO_2$, and/or a plastic, such as silicone, or consist entirely of one or more of said materials. The wafer can also have one or more wafer layers, each having one surface. The aluminum layer or the layer containing aluminum may be provided on the surface of one or more wafer layers.

The object is furthermore achieved by a method for preparing lithium alkyl aluminates according to the general formula Li[AlR$_4$] (I). R is selected from the group consisting of a (C1-C10) alkyl radical, a partially or fully halogenated (C1-C10) alkyl radical, a (trialkylsilyl) alkyl radical R$^A$—Si(R$^B$)$_3$, a benzyl radical, a partially or fully substituted benzyl radical, a mononuclear or polynuclear arene, a partially or fully substituted mononuclear or polynuclear arene, a mononuclear or polynuclear heteroarene and a partially or fully substituted mononuclear or polynuclear heteroarene. R$^A$ is selected from the group consisting of a (C1-C6) alkylene radical and a partially or fully halogenated (C1-C6) alkylene radical. R$^B$ radicals are selected independently of one another from the group consisting of a (C1-C10) alkyl radical, a partially or fully halogenated (C1-C10) alkyl radical and an O—R$^E$ alkyl ether radical. Radicals R$^E$ are selected independently of one another from the group consisting of a (C1-C10) alkyl radical, a partially or fully halogenated (C1-C10) alkyl radical, a benzyl radical, a partially or fully substituted benzyl radical, a mononuclear or polynuclear arene, a partially or fully substituted mononuclear or polynuclear arene, a mononuclear or polynuclear heteroarene and a partially or fully substituted mononuclear or polynuclear heteroarene.

The method comprises the step of:
Reacting LiAlH$_4$ with a compound according to the general formula RLi, wherein
R is selected from the group consisting of a (C1-C10) alkyl radical, a partially or fully halogenated (C1-C10) alkyl radical, a (trialkylsilyl) alkyl radical R$^A$—Si(R$^B$)$_3$, a benzyl radical, a partially or fully substituted benzyl radical, a mononuclear or polynuclear arene, a partially or fully substituted mononuclear or polynuclear arene, a mononuclear or polynuclear heteroarene and a partially or fully substituted mononuclear or polynuclear heteroarene, wherein
  R$^A$ is selected from the group consisting of a (C1-C6) alkylene radical and a partially or fully halogenated (C1-C6) alkylene radical,
  R$^B$ radicals are selected independently of one another from the group consisting of a (C1-C10) alkyl radical, a partially or fully halogenated (C1-C10) alkyl radical and an O—R$^E$ alkyl ether radical,
wherein radicals R$^E$ are selected independently of one another from the group consisting of a (C1-C10) alkyl radical, a partially or fully halogenated (C1-C10) alkyl radical, a benzyl radical, a partially or fully substituted benzyl radical, a mononuclear or polynuclear arene, a partially or fully substituted mononuclear or polynuclear arene, a mononuclear or polynuclear heteroarene and a partially or fully substituted mononuclear or polynuclear heteroarene, in at least one aprotic solvent in a reaction vessel,
wherein a molar ratio LiAlH$_4$:RLi is ≥0.25.

The aprotic solvent can also be a solvent mixture. Therefore, for example, the aprotic solvent may comprise two or more aprotic solvents.

The term reaction vessel is not limited to a volume, a material property, equipment or a shape.

The molar ratio LiAlH$_4$:RLi is ≥1:4. Therefore, the molar ratio LiAlH$_4$:RLi is at least one quarter, i.e. 0.25.

A significant advantage of the claimed method for preparing lithium alkyl aluminates according to the general formula Li[AlR$_4$] (I) is that the commercially available reactant LiAlH$_4$ is the starting material, which is relatively inexpensive to obtain and easy to handle. Advantageously, the preparation of an aluminum precursor compound, which preparation is generally complex and thus time-consuming and cost-intensive, is therefore dispensed with. In addition, the purity of the LiAlH$_4$ used is only decisive for the yield, but usually has no bearing on the purity of the particular product Li[AlR$_4$](I), especially not if isolation takes place. For in that case, the LiH precipitated during the reaction and any impurities possibly originating from the reactant LiAlH$_4$ are separated off by simple filtration. The desired product is obtained by removing the solvent of the filtrate in a fine vacuum ($10^{-3}$ mbar). Instead of filtration, separation by decantation of the LiH precipitated during the reaction and of any impurities possibly originating from the reactant LiAlH$_4$ may also be provided for. The product is then also isolated by removing the solvent of the filtrate in a fine vacuum ($10^{-2}$-$10^{-3}$ mbar). Consequently, the claimed method provides isolation without costly purification steps, such as recrystallization, or a time-consuming, energy-consuming and cost-intensive stripping of a solvent bound in the product. As a result, the method can be carried out relatively simply, quickly and inexpensively. The isolated product Li[AlR$_4$] (I) can be used to prepare a stock solution in an aprotic solvent, for example an aliphatic hydrocarbon. Such a stock solution can then be stored and used for any reactions, such as, for example, alkylation of an element halide or metal halide, without further preparations. In the alternative or in addition, the filtrate which is present after removal of the LiH precipitated during the reaction and any impurities originating from the reactant LiAlH$_4$ can be stored and used as stock solution for further reactions.

The use of an aprotic, in particular non-ethereal, solvent or solvent mixture advantageously prevents the target compounds Li[AlR$_4$] (I), which can be prepared by the claimed method, from being obtained as solvent adducts, in particular as ether adducts. The compounds Li[AlR$_4$] (I), which can be prepared by the claimed method, exhibit good solubility in various non-ethereal solvents, in particular in nonpolar solvents, such as, for example, the various isomers of pentane, hexane and decane. Therefore, the synthesis protocol of the claimed method for preparing compounds of the Li[AlR$_4$] (I) type prevents any subsequent products from being possibly contaminated with ether or oxygen traces, which is important also with regard to further reactions of the compounds Li[AlR$_4$] (I).

In the simplest case, the claimed method for preparing a compound according to the general formula Li[AlR$_4$] (I) advantageously provides for only one reaction step. This is because, in the simplest case, the preparation of a compound according to the general formula Li[AlR$_4$] (I) is followed directly, i.e. without any purification step, by an additional reaction, for example a selective partial or complete alkylation of an element halide or metal halide. According to the definition mentioned further above, this is then an in situ generation of Li[AlR$_4$] (I). Therefore, the desired end product, for example a partially or fully alkylated element halide or metal halide, may be advantageously prepared by means of one-pot synthesis.

Overall, the disadvantages of the prior art are overcome by the claimed method for preparing a lithium alkyl aluminate according to the general formula Li[AlR$_4$] (I). In particular, the upstream preparation of an aluminum precursor compound, such as AlBu$_3$×Et$_2$O (H. Lehmkuhl, *Liebigs Ann. Chem.* 1968, 719, 40-49) and AltBu$_3$ (W. Uhl, *Z. Anorg. Allg. Chem.* 1989, 570, 37-53), and coordinating, in particular ethereal, solvents are dispensed with. The claimed method can be carried out in a simple, cost-effective and reproducible manner, wherein the desired target compounds according to the general formula Li[AlR$_4$] (I) are obtained in high purity and good yield. Overall, the claimed method is satisfactory from an (atom-)economic and ecological point of view.

In one embodiment of the claimed method, R is selected from the group consisting of Me, Et, nPr, iPr, nBu, tBu, sBu, iBu, CH(Me)(iPr), CH(Me)(nPr), CH(Et)$_2$, CH(Et)(Me)$_2$, CH$_2$C$_6$H$_5$, CHS, CH$_2$SiMe$_3$, CH$_2$SiEt$_3$, CH$_2$Si(Me)$_2$(OMe), CH$_2$Si(Et)$_2$(OEt), CH$_2$Si(Me)(tBu)(OMe), CH$_2$Si(tBu)(C$_6$H$_5$)(OtBu) and CH$_2$Si(iPr)$_2$(OiPr). With the claimed method, these lithium alkyl aluminates, e.g. of Li[AltBu$_4$] and Li[Al(CH$_2$SiMe$_3$)$_4$], can be prepared in good yield and high purity in a reproducible solvent-free and, in particular, ether-free manner. It is also advantageous that, as observed by Lehmkuhl (*Liebigs Ann. Chem.* 1968, 719, 40-49), there was no partial dissociation of Li[Al(tBu)$_4$] in tBuLi and AltBu$_3$ in the compound Li[Al(tBu)$_4$] obtained by the claimed method. According to Clayden and Yasin, it can be checked quite easily and quickly whether the lithium alkyl aluminate Li[AltBu$_4$] obtained by the claimed method is contaminated by free tBuLi, namely by adding tetrahydrofuran. Free tBuLi reacts with tetrahydrofuran in an ether cleavage reaction with evolution of gas. In contrast, Li[Al(tBu)$_4$] is dissolved. (J. Clayden, S. A. Yasin, New J. Chem. 2002, 26, 191-192) The alkyl radicals R of the compounds according to the general formula Li[AlR$_4$] (I) that can be prepared by the claimed method are advantageously transferable selectively to element halides or metal halides. Thus, for example, one, two, three or four tert-butyl radicals can be selectively transferred, depending on the reaction conditions selected, when using Li[AltBu$_4$].

A further embodiment of the claimed method for preparing a compound according to the general formula Li[AlR$_4$] (I) provides for the reaction of LiAlH$_4$ with the compound RLi to comprise the steps of:
i) providing a solution or a suspension of LiAlH$_4$ in a first solvent S1,
ii) adding the compound RLi,
wherein during and/or after the addition of RLi, a reaction of LiAlH$_4$ with the compound RLi takes place.

The first solvent S1 can also be a solvent mixture, i.e. comprise two or more solvents.

In a further embodiment of the claimed method, the compound RLi suspended or dissolved in a second solvent S2 is added in step ii). Depending on the other reaction parameters, this can be advantageous for better control of the course of the reaction or of the exothermicity. The addition of the lithium alkyl RLi as a solution or suspension in the second solvent S2 takes place, for example, using a metering device, in particular by dropwise addition or injection. In the alternative or in addition, a shut-off valve and/or a stop valve can be provided in a supply line of the reaction vessel.

A further embodiment of the claimed method provides for the second solvent S2 to be miscible with or identical to the first solvent S1. The definition of the term "miscible" as used in connection with this invention is given above.

In yet another embodiment of the claimed method for preparing a compound according to the general formula Li[AlR$_4$] (I), LiAlH$_4$ is provided or supplied as a solid. RLi is then added as a solution or suspension in the second solvent S2, for example by dropwise addition or injection.

A further embodiment of the claimed method provides for the provision or supply of a solution or suspension of RLi in a first solvent S1 in a first step. In a second step, LiAlH$_4$ is added as a solid or as a suspension or solution in a second solvent S2. The first solvent S1 and the second solvent S2 are miscible, but they may also be identical.

Depending on the choice of solvent or solvent mixture and the other reaction conditions, such as, for example, the form of addition of RLi, i.e. as a substance or solid or dissolved in the second solvent S2, rate of addition of RLi, stirring speed, internal temperature of the reaction vessel, the reaction of LiAlH$_4$ with the lithium alkyl takes place already during and/or after the addition of RLi.

A further variant of the claimed method for preparing a compound according to the general formula Li[AlR$_4$] (I) provides for the first solvent S1 and the second solvent S2 to be selected independently of one another from the group consisting of hydrocarbons, benzene and benzene derivatives. For example, the first solvent S1 and the second solvent S2 are selected independently of one another from the group consisting of n-pentane, n-hexane, n-heptane, n-octane, n-nonane, n-decane, n-undecane, n-dodecane, cyclopentane, cyclohexane, cycloheptane, 1-pentene, 1-hexene, 1-heptene, 1-octene, 1-nonene, 1-decene, 1-undecene, 1-dodecene, cyclohexene, benzene, toluene, xylene and isomers thereof. It is also possible for the solvent S1 and/or the solvent S2 to each comprise two or more solvents, in particular as a mixture of aliphatic hydrocarbons in each case. The choice of the solvent or solvent mixture depends inter alia on a further reaction of the prepared lithium alkyl aluminate Li[AlR$_4$] (I) that follows immediately thereafter, i.e. without any previous purification and/or isolation step. It may also be provided to store the reaction mixture comprising the lithium alkyl aluminate Li[AlR$_4$] (I) for later further use. Alternatively, the LiH formed in the preparation of the respective lithium alkyl aluminate Li[AlR$_4$] (I) and any impurities originating from the reactants are separated off by filtration or decantation. The filtrate is then immediately reacted further, for example, or stored as stock solution. In all the above cases, it is advantageous to already consider the further possible uses of the respective lithium alkyl aluminate Li[AlR$_4$] (I) when planning its preparation. For example, where alkylations of element halides or metal halides are planned, the preferred solvents are n-pentane, n-hexane, i-hexane and n-decane possible mixtures. The use of a relatively high-boiling solvent, for example n-decane, or a relatively high-boiling solvent mixture is particularly advantageous if the particular alkylated target compound is separable by distillation. The separation of the salt load obtained in the reaction as a by-product is thus possible in a particularly simple and quantitative manner. This is because after the distillation is complete, it remains as residue in the reaction vessel.

In another variant of the claimed method, the reaction of LiAlH$_4$ with the compound RLi is carried out at an internal temperature $T_U$ of the reaction vessel, the internal temperature $T_U$ being between −30° C. and 100° C. Owing to the exothermicity of the reaction, it may be advantageous to select the rate of addition of RLi and/or the internal temperature $T_U$ of the reaction vessel to be comparatively low. In the alternative or in addition, it may be provided for a solution or suspension of RLi in the second solvent S2 or solvent mixture to be added. The respective procedure should be selected taking into account the other reaction parameters, such as the LiAlH$_4$ concentration and the solvent or solvent mixture.

An internal temperature of the reaction vessel may be determined using a temperature sensor or a plurality of temperature sensors for one or more regions of the reaction vessel. At least one temperature sensor is provided for determining the internal temperature $T_U$, which generally corresponds to an average temperature $T_{D11}$ of the reaction mixture.

In another variant of the claimed method for preparing a compound according to the general formula Li[AlR$_4$] (I), the internal temperature T$_U$ of the reaction vessel is between −15° C. and 80° C. In a further variant, the internal temperature T$_U$ of the reaction vessel during the reaction of LiAlH$_4$ with compound RLi is between −10° C. and 50° C.

In a further embodiment of the claimed method, the internal temperature T$_U$ of the reaction vessel is regulated and/or controlled using a heat transfer medium W$_U$. For this purpose, a cryostat can be used, for example, which contains a heat transfer medium, which ideally can function both as a coolant and as a heating medium. The use of the heat transfer medium W$_U$ allows any deviations of the internal temperature T$_U$ from a setpoint value T$_{S11}$ defined for the reaction of LiAlH$_4$ with RLi to be largely absorbed or compensated. A constant internal temperature T$_U$ is almost impossible to implement due to the usual device deviations. However, by using the heat transfer medium W$_U$, the reaction of LiAlH$_4$ with RLi can be carried out at least within a preselected temperature range or within multiple preselected temperature ranges. For example, depending on the remaining reaction parameters, it may be advantageous to provide a temperature program for even better control of the course of the reaction or the exothermic reaction. For example, a lower temperature or a lower temperature range may be selected during a first phase of adding RLi than in a second phase of adding RLi. It is also possible to provide more than two phases of the addition and thus more than two preselected temperatures or temperature ranges. Depending on the choice of the other reaction conditions, such as, for example, the LiAlH$_4$ concentration and the solvent or solvent mixture, it may be favorable during and/or after the addition of RLi to decrease, possibly even stepwise, the internal temperature T$_U$ of the reaction vessel using the heat transfer medium W$_U$. This may possibly ensure that the reaction of LiAlH$_4$ with RLi is carried out more slowly and thus in a more controlled manner, in particular as regards the heat of reaction. Following a reduction in the internal temperature T$_U$ of the reaction vessel, a possibly even stepwise increase in the internal temperature T$_U$ may be provided in order to complete the reaction of LiAlH$_4$ with RLi.

In yet another embodiment of the claimed method for preparing a compound according to the general formula Li[AlR$_4$] (I), the internal temperature T$_H$ of the reaction vessel during and/or after the addition of the compound RLi is between −40° C. and 80° C. In a further variant, the internal temperature T$_H$ of the reaction vessel during and/or after the addition of the compound RLi is between −30° C. and 50° C. In yet another variant, the internal temperature T$_H$ of the reaction vessel during and/or after the addition of the compound RLi is between −20° C. and 35° C. At least one temperature sensor is provided for determining the internal temperature T$_H$, which generally corresponds to an average temperature T$_{D22}$ of the reaction mixture. The temperature sensor may be identical to that for determining the internal temperature T$_U$.

In a further embodiment of the claimed method, the internal temperature T$_H$ of the reaction vessel is regulated and/or controlled using a heat transfer medium W$_H$. For this purpose, a cryostat can be used, for example, which contains a heat transfer medium, which ideally can function both as a coolant and as a heating medium. The use of the heat transfer medium W$_H$ allows deviations of the internal temperature T$_H$ from a setpoint value T$_{S22}$ defined for the time during and/or after the addition of RLi to be largely absorbed or compensated. A constant internal temperature T$_H$ is almost impossible to implement due to the usual device deviations. However, by using the heat transfer medium W$_H$, the reaction of LiAlH$_4$ with RLi can be carried out at least within a preselected temperature range or within multiple preselected temperature ranges. For example, depending on the remaining reaction parameters, it may be advantageous to provide a temperature program for even better control of the course of the reaction or the exothermic reaction. For example, a lower temperature or a lower temperature range may be selected during a first phase of adding RLi than in a second phase of adding RLi. It is also possible to provide more than two phases of the addition and thus more than two preselected temperatures or temperature ranges.

Yet another embodiment of the claimed method provides for performing a further step comprising the isolation of Li[AlR$_4$] (I) after the step comprising the reaction of LiAlH$_4$ with compound RLi:

i) as a solution, comprising Li[AlR$_4$] (I) and the at least one aprotic solvent, or ii) as a solid.

The aprotic solvent may also comprise two or more solvents.

The reaction mixture present after complete reaction of LiAlH$_4$ with RLi, comprising a lithium alkyl aluminate according to the general formula Li[AlR$_4$](I), can be subjected to a further reaction immediately, i.e. without any upstream purification step, or can be stored for later use. In addition to the lithium alkyl aluminate according to the general formula Li[AlR$_4$] (I) prepared in each case, the reaction mixture usually has only one defined by-product, namely LiH, which is obtained during the preparation process. There may also be impurities originating from the reactants. For convenience, the reaction mixture present after complete reaction of LiAlH$_4$ with RLi will be hereinafter also referred to as a suspension.

Alternatively, the compound Li[AlR$_4$] (I) is isolated i) as a solution comprising Li[AlR4] (I) and the aprotic solvent, or ii) as a solid. Isolation may comprise one or more steps in each case.

In one variant of the claimed method, isolation comprises a filtration step. Several filtration steps can also be provided, if necessary one or more filtrations over a cleaning medium, e.g. activated carbon or silica, e.g. Celite®. The filter cake comprising the LiH that precipitated during the reaction as well as any impurities possibly originating from the reactants, may be washed with a small amount of a relatively volatile solvent, such as n-pentane, n-hexane or i-hexane, in order to extract any Li[AlR$_4$] (I) product possibly contained therein. Decanting may be provided as an alternative to filtration. As a result, the solution comprising the desired target compound can be likewise separated from the LiH precipitated during the reaction and, if appropriate, from the impurities originating from the reactants. In addition, the remaining solid can be washed with a small amount of a relatively volatile solvent, such as, for example, n-pentane, n-hexane or i-hexane, or product optionally contained therein can be extracted. These isolation steps can be provided independently of whether or not Li[AlR$_4$] (I) is to be isolated as i) solution in the aprotic solvent or as ii) solid and then stored and/or further used.

Isolation may comprise further method steps, such as, for example: the reduction of the volume of the mother liquor, i.e. concentration, for example by means of "bulb to bulb"; the addition of a solvent and/or a solvent exchange in order to achieve precipitation of the product out of the mother liquor and/or to remove impurities and/or reactants; washing and drying including freeze-drying of the product; condensation; distillation; and/or sublimation.

If Li[AlR$_4$] (I) is to be isolated as i) a solution comprising Li[AlR$_4$] (I) and the aprotic solvent, the solution obtained, for example, by a filtration step or decantation, can be further reacted immediately and/or stored as stock solution. Such a stock solution can be used e.g. for alkylations of element halides or metal halides that can be performed, inter alia, in non-ethereal, aprotic solvents, such as n-pentane, n-hexane, i-hexane and n-decane and possible mixtures thereof.

If Li[AlR$_4$] (I) is to be isolated as ii) a solid, said solid can be also further reacted immediately and/or stored. Moreover, the isolated compound Li[AlR$_4$](I) may be used to prepare a defined stock solution in a solvent. In this case, the solvent chosen for the stock solution is different from the one used in the preparation of Li[AlR$_4$] (I).

The object is further achieved by a solution comprising a lithium alkyl aluminate according to the general formula Li[AlR$_4$] (I) and at least one aprotic solvent obtainable by a method for preparing a compound according to the general formula Li[AlR$_4$] (I) according to any one of the embodiments described above. R is selected from the group consisting of a (C1-C10) alkyl radical, a partially or fully halogenated (C1-C10) alkyl radical, a (trialkylsilyl) alkyl radical R$^A$—Si(R$^B$)$_3$, a benzyl radical, a partially or fully substituted benzyl radical, a mononuclear or polynuclear arene, a partially or fully substituted mononuclear or polynuclear arene, a mononuclear or polynuclear heteroarene and a partially or fully substituted mononuclear or polynuclear heteroarene. R$^A$ is selected from the group consisting of a (C1-C6) alkylene radical and a partially or fully halogenated (C1-C6) alkylene radical. R$^B$ radicals are selected independently of one another from the group consisting of a (C1-C10) alkyl radical, a partially or fully halogenated (C1-C10) alkyl radical and an O—R$^E$ alkyl ether radical. Radicals R$^E$ are selected independently of one another from the group consisting of a (C1-C10) alkyl radical, a partially or fully halogenated (C1-C10) alkyl radical, a benzyl radical, a partially or fully substituted benzyl radical, a mononuclear or polynuclear arene, a partially or fully substituted mononuclear or polynuclear arene, a mononuclear or polynuclear heteroarene and a partially or fully substituted mononuclear or polynuclear heteroarene.

The solution can be produced simply, inexpensively and reproducibly by means of the method described above. This is particularly advantageous for an industrial application. The solution can be used, for example, in the selective alkylation of element halides or metal halides. The compounds of the Li[AlR$_4$] (I) type are characterized in particular by the fact that one, two, three or all four radicals R are selectively transferable. The claimed solution can be either reacted further immediately after its preparation and/or be stored as a stock solution. The solution is obtainable by filtration or decantation based on the suspension present after complete reaction of LiAlH$_4$ with RLi comprising a lithium alkyl aluminate according to the general formula Li[AlR$_4$] (I) and at least one aprotic solvent, according to an embodiment of the method described above for preparing a lithium alkyl aluminate according to the general formula Li[AlR$_4$] (I). The suspension usually has only one defined by-product obtained during the preparation process, namely LiH, and optionally impurities of the reactant LiAlH$_4$. Ethereal impurities are ruled out on account of the method for preparing the solution. This is particularly favorable in view of the use of such a solution, in particular for selective alkylations of element halides or metal halides. The alkylation products are used, inter alia, as precursor compounds for vapor deposition methods. In the presence of oxygen traces that can be attributed, for example, to the use of ethereal solvents in upstream syntheses, unusable metal layers or metal-containing layers are optionally produced with these methods.

Furthermore, the object is achieved by lithium alkyl aluminates according to the general formula Li[AlR$_4$] (I), obtainable by a method for preparing a compound according to the general formula Li[AlR$_4$] (I) according to any one of the embodiments described above. R is selected from the group consisting of a (C1-C10) alkyl radical, a partially or fully halogenated (C1-C10) alkyl radical, a (trialkylsilyl) alkyl radical R$^A$—Si(R$^B$)$_3$, a benzyl radical, a partially or fully substituted benzyl radical, a mononuclear or polynuclear arene, a partially or fully substituted mononuclear or polynuclear arene, a mononuclear or polynuclear heteroarene and a partially or fully substituted mononuclear or polynuclear heteroarene. Here, R$^A$ is selected from the group consisting of a (C1-C6) alkylene radical and a partially or fully halogenated (C1-C6) alkylene radical. R$^B$ radicals are selected independently of one another from the group consisting of a (C1-C10) alkyl radical, a partially or fully halogenated (C1-C10) alkyl radical and an O—R$^E$ alkyl ether radical. Radicals R$^E$ are selected independently of one another from the group consisting of a (C1-C10) alkyl radical, a partially or fully halogenated (C1-C10) alkyl radical, a benzyl radical, a partially or fully substituted benzyl radical, a mononuclear or polynuclear arene, a partially or fully substituted mononuclear or polynuclear arene, a mononuclear or polynuclear heteroarene and a partially or fully substituted mononuclear or polynuclear heteroarene.

The lithium alkyl aluminates of the Li[AlR$_4$] (I) type obtainable according to an embodiment of the method described above, can be prepared selectively, simply, cost-effectively and reproducibly in good yields and purities, in particular based on the commercially available compounds LiAlH$_4$ and RLi. Consequently, they can also be produced on an industrial scale. Owing to the chosen preparation method, the compounds of the Li[AlR$_4$] (I) type, which are generally present as solids or liquids, have, in particular, no impurities stemming from inorganic salts or ethereal solvents.

Compounds of the Li[AlR$_4$] (I) type are suitable in particular as transfer reagents for transferring at least one of the four radicals R to an element halide or metal halide. This is because, when using Li[AlR$_4$] (I) as the transfer reagent, it is advantageously possible to selectively transfer one, two, three or four radicals R. Therefore, the preparation of heteroleptic complexes is also possible when using Li[AlR$_4$] (I). In the context of the present invention, one speaks of the synthesis of a heteroleptic complex when only part of the halide anions of the element halide or metal halide used are replaced by one radical R in each case. Alternatively, some of the halide anions may have already been replaced by other ligands different from R prior to reaction with Li[AlR$_4$] (I). It is furthermore advantageous that in the case of a transfer of four radicals R based on one molar equivalent of Li[AlR$_4$] (I), the resulting salt load is significantly reduced as compared to when using an alkylation reagent, by means of which only one radical R can be transferred per molar equivalent. In general, only LiAlX$_4$ is obtained as a by-product that can be separated in a relatively simple quantitative manner. In addition, compounds according to the general formula Li[AlR$_4$] (I) can be prepared in various non-ethereal organic solvents and exhibit good solubility in them, in particular in nonpolar solvents, such as, for example, the various isomers of pentane, hexane and decane. As a result, and with a view to a further reaction of Li[AlR$_4$] (I), it is excluded from the outset that the respective subsequent product, in particular an alkylation product or its subsequent products, are possibly contaminated with ether or oxygen traces. In particular with regard to an industrial application, the heat of reaction that is lower in comparison to reactions with common alkylation reagents is advantageous when using Li[AlR$_4$] (I) as a transfer reagent. As a result, not only are energy costs for cooling reduced, but also a more favorable process control is made possible under safety aspects.

Compounds according to the general formula Li[AlR$_4$] (I) can be further reacted and/or stored immediately after their isolation. As an alternative or in addition, the respective compound Li[AlR$_4$] (I) may be used to prepare a defined stock solution in a nonpolar solvent.

The claimed lithium alkyl aluminates according to the general formula Li[AlR$_4$] (I) are to be assessed as satisfactory from an (atom-)economic and ecological point of view.

Furthermore, the object is achieved by the use of
a) a lithium alkyl aluminate according to the general formula Li[AlR$_4$] (I),
or
b) a solution,
comprising a lithium alkyl aluminate according to the general formula Li[AlR$_4$](I)
and at least one aprotic solvent,
obtained or obtainable by a method for preparing a compound according to the general formula Li[AlR$_4$] (I) according to any one of the embodiments described above,
as a transfer reagent for transferring at least one group R, in particular to a compound according to the general formula E(X)$_q$.

R is selected from the group consisting of a (C1-C10) alkyl radical, a partially or fully halogenated (C1-C10) alkyl radical, a (trialkylsilyl) alkyl radical R$^A$—Si(R$^B$)$_3$, a benzyl radical, a partially or fully substituted benzyl radical, a mononuclear or polynuclear arene, a partially or fully substituted mononuclear or polynuclear arene, a mononuclear or polynuclear heteroarene and a partially or fully substituted mononuclear or polynuclear heteroarene. R$^A$ is selected from the group consisting of a (C1-C6) alkylene radical and a partially or fully halogenated (C1-C6) alkylene radical. R$^B$ radicals are selected independently of one another from the group consisting of a (C1-C10) alkyl radical, a partially or fully halogenated (C1-C10) alkyl radical and an O—R$^E$ alkyl ether radical. Radicals R$^E$ are selected independently of one another from the group consisting of a (C1-C10) alkyl radical, a partially or fully halogenated (C1-C10) alkyl radical, a benzyl radical, a partially or fully substituted benzyl radical, a mononuclear or polynuclear arene, a partially or fully substituted mononuclear or polynuclear arene, a mononuclear or polynuclear heteroarene and a partially or fully substituted mononuclear or polynuclear heteroarene. E is selected from the group consisting of aluminum, gallium, indium, thallium, germanium, tin, lead, antimony, bismuth, zinc, cadmium, mercury and phosphorus. In addition, X=halogen, in particular X=F, Cl or Br, and q=2, 3 or 4.

The aforementioned use of a lithium alkyl aluminate according to the general formula Li[AlR$_4$] (I) or of a solution comprising a lithium alkyl aluminate according to the general formula Li[AlR$_4$] (I) and at least one aprotic solvent as a transfer reagent, is a method for transferring at least one radical R to a compound according to the general formula E(X)$_q$ for preparing a compound according to the general formula E(X)$_{q-p}$R$_p$ (II) using a lithium alkyl aluminate according to the general formula Li[AlR$_4$] (I). In particular, the lithium alkyl aluminate according to the general formula Li[AlR$_4$] (I) to be used is present as a solid or liquid obtained or obtainable by a method for preparing a compound according to the general formula Li[AlR$_4$] (I) according to any one of the embodiments described above. Alternatively, the lithium alkyl aluminate to be used according to the general formula Li[AlR$_4$] (I) is used as a solution comprising a lithium alkyl aluminate according to the general formula Li[AlR$_4$](I) and at least one aprotic solvent. The solution is also obtained or obtainable in each case by a method for preparing a compound according to the general formula Li[AlR$_4$] (I) according to any one of the embodiments described above.

R is selected from the group consisting of a (C1-C10) alkyl radical, a partially or fully halogenated (C1-C10) alkyl radical, a (trialkylsilyl) alkyl radical R$^A$—Si(R$^B$)$_3$, a benzyl radical, a partially or fully substituted benzyl radical, a mononuclear or polynuclear arene, a partially or fully substituted mononuclear or polynuclear arene, a mononuclear or polynuclear heteroarene and a partially or fully substituted mononuclear or polynuclear heteroarene. R$^A$ is selected from the group consisting of a (C1-C6) alkylene radical and a partially or fully halogenated (C1-C6) alkylene radical. R$^B$ radicals are selected independently of one another from the group consisting of a (C1-C10) alkyl radical, a partially or fully halogenated (C1-C10) alkyl radical and an O—R$^E$ alkyl ether radical. Radicals R$^E$ are selected independently of one another from the group consisting of a (C1-C10) alkyl radical, a partially or fully halogenated (C1-C10) alkyl radical, a benzyl radical, a partially or fully substituted benzyl radical, a mononuclear or polynuclear arene, a partially or fully substituted mononuclear or polynuclear arene, a mononuclear or polynuclear heteroarene and a partially or fully substituted mononuclear or polynuclear heteroarene. E is selected from the group consisting of aluminum, gallium, indium, thallium, germanium, tin, lead, antimony, bismuth, zinc, cadmium, mercury and phosphorus. In addition, X=halogen, in particular X=F, Cl or Br, q=2, 3 or 4 and p=1, 2, 3 or 4.

The method comprises the steps of:
a) providing
the lithium alkyl aluminate according to the general formula Li[AlR$_4$] (I)
or
a solution comprising a lithium alkyl aluminate according to the general formula Li[AlR$_4$] (I) and at least one aprotic solvent,
and
b) reacting E(X)$_q$ with the lithium alkyl aluminate Li[AlR$_4$] (I) in at least one aprotic solvent S$_A$ in a reaction vessel.

The aprotic solvent in step a) may also be a solvent mixture. Therefore, the aprotic solvent may comprise two or more aprotic solvents. The aprotic solvent from step a) and the aprotic solvent S$_A$ from step b) are miscible, but they may also be identical. A definition of the term "miscible" is given above.

The term reaction vessel is not limited to a volume, a material property, equipment or a shape.

Variable q is dependent on the oxidation number of the respective element E. For example, q=2 in the case of zinc, q=3 in the case of aluminum and q=4 in the case of tin.

The claimed method can be used to advantageously selectively transfer one, two, three or four radicals R using Li[AlR$_4$] (I) as a transfer reagent. Therefore, the preparation of heteroleptic complexes is also possible. In the context of the present invention, one speaks of the synthesis of a heteroleptic complex when only part of the halide anions of the element halide or metal halide $E(X)_q$ used are replaced by one radical R in each case. Alternatively, some of the halide anions may have already been replaced by other ligands different from R prior to reaction with Li[AlR$_4$] (I). Therefore, in addition to the selective preparation of compounds of the $E(X)_{q-p}R_p$ (II) type, the claimed method can also be applied to selectively prepare a plurality of compounds in which some of the halide anions are replaced by ligands other than R.

What is particularly advantageous about the claimed use of Li[AlR$_4$] (I) as a transfer reagent or the claimed method for transferring at least one radical R to a compound according to the general formula $E(X)_q$ using a lithium alkyl aluminate according to the general formula Li[AlR$_4$] (I), is that—in particular when transferring four radicals R based on one molar equivalent of transfer reagent—the accruing salt load is markedly reduced compared to when using an alkylation reagent through which only one radical R can be transferred per molar equivalent. This is because, in general, only LiAlX$_4$ is obtained as a by-product that can be separated in a relatively simple quantitative manner. Separation can be effected, for example, by means of a filtration step and/or a removal by distillation or condensation of a volatile target compound and/or a solvent or solvent mixture. Condensation may be followed by purification by distillation. In individual cases, the salt load instead consists of LiX. However, separation of LiX is also comparatively easily quantitatively possible by the selection of the aprotic solvent. For this purpose, a filtration step and/or separation of a volatile target compound and/or of a solvent or solvent mixture by means of distillation or condensation may likewise be provided. The latter may be followed by purification by distillation. Thus, purification of the respective alkylation product can generally be implemented in a particularly simple and cost-effective manner. This is advantageous in view of its preparation on an industrial scale and its further use. A further advantage is that ethereal solvents can be dispensed with completely when using Li[AlR$_4$](I) as a transfer reagent. Li[AlR$_4$] (I) can be prepared in various non-ethereal organic solvents and exhibits good solubility in them, in particular in nonpolar solvents, such as, for example, the various isomers of pentane, hexane and decane. As a result, it is excluded from the outset that the respective alkylation product or its subsequent products are possibly contaminated with ether or oxygen traces. In particular with regard to an industrial application, the heat of reaction that is lower in comparison to reactions with common alkylation reagents is advantageous. As a result, not only are energy costs for cooling reduced, but also a more favorable process control is made possible under safety aspects.

The compounds according to the general formula $E(X)_{q-p}R_p$ (II) that can be prepared by the claimed method using Li[AlR$_4$] (I) are obtained in good to very good yields of, in some cases, >80% and in high purity, as set forth above.

In the simplest case, namely in situ preparation of the respective alkylated product, the claimed use or method advantageously provides for only one reaction step for a further reaction that follows directly thereafter. Consequently, the desired end product may be advantageously prepared by means of one-pot synthesis.

Overall, the disadvantages of the prior art are overcome by the claimed use of a lithium alkyl aluminate according to the general formula Li[AlR$_4$] (I) as a transfer reagent or the claimed method for transferring at least one radical R to a compound according to the general formula $E(X)_q$ for preparing a compound according to the general formula $E(X)_{q-p}R_p$ (II) using a compound of the Li[AlR$_4$] (I) type. The claimed method is satisfactory from an (atom-)economic and ecological point of view.

The object is moreover achieved by the use of a lithium alkyl aluminate according to the general formula Li[AlR$_4$] (I) for preparing compounds according to the general formula (R)EH$_2$ (III). In particular, the lithium alkyl aluminate to be used according to the general formula Li[AlR$_4$] (I) is present as a solid or liquid, obtained or obtainable by a method for preparing a compound according to the general formula Li[AlR$_4$] (I) according to any one of the embodiments described above. Alternatively, the lithium alkyl aluminate to be used according to the general formula Li[AlR$_4$] (I) is used as a solution comprising a lithium alkyl aluminate according to the general formula Li[AlR$_4$](I) and at least one aprotic solvent. The solution is also obtained or obtainable in each case by a method for preparing a compound according to the general formula Li[AlR$_4$] (I) according to any one of the embodiments described above. R is selected from the group consisting of a (C1-C10) alkyl radical, a partially or fully halogenated (C1-C10) alkyl radical, a (trialkylsilyl) alkyl radical $R^A$—Si($R^B$)$_3$, a benzyl radical, a partially or fully substituted benzyl radical, a mononuclear or polynuclear arene, a partially or fully substituted mononuclear or polynuclear arene, a mononuclear or polynuclear heteroarene and a partially or fully substituted mononuclear or polynuclear heteroarene. $R^A$ is selected from the group consisting of a (C1-C6) alkylene radical and a partially or fully halogenated (C1-C6) alkylene radical. $R^B$ radicals are selected independently of one another from the group consisting of a (C1-C10) alkyl radical, a partially or fully halogenated (C1-C10) alkyl radical and an O—$R^E$ alkyl ether radical. Radicals $R^E$ are selected independently of one another from the group consisting of a (C1-C10) alkyl radical, a partially or fully halogenated (C1-C10) alkyl radical, a benzyl radical, a partially or fully substituted benzyl radical, a mononuclear or polynuclear arene, a partially or fully substituted mononuclear or polynuclear arene, a mononuclear or polynuclear heteroarene and a partially or fully substituted mononuclear or polynuclear heteroarene. E is selected from the group consisting of phosphorus, antimony and bismuth.

The above-mentioned use of a lithium alkyl aluminate according to the general formula Li[AlR$_4$] (I) for preparing compounds according to the general formula (R)EH$_2$ (III) is a method for preparing compounds according to the general formula (R)EH$_2$ (III) using a lithium alkyl aluminate according to the general formula Li[AlR$_4$] (I). In particular, the lithium alkyl aluminate according to the general formula Li[AlR$_4$] (I) to be used is present as a solid or liquid, obtained or obtainable by a method for preparing a compound according to the general formula Li[AlR$_4$] (I) according to any one of the embodiments described above. Alternatively, the lithium alkyl aluminate to be used according to the general formula Li[AlR$_4$] (I) is used as a solution comprising a lithium alkyl aluminate according to the general formula Li[AlR$_4$] (I) and at least one aprotic solvent. The solution is also obtained or obtainable in each case by a method for preparing a compound according to the general formula Li[AlR$_4$] (I) according to any one of the embodiments described above. R is selected from the group consisting of a (C1-C10) alkyl radical, a partially or fully halogenated (C1-C10) alkyl radical, a (trialkylsilyl) alkyl radical $R^A$—Si($R^B$)$_3$, a benzyl radical, a partially or fully substituted benzyl radical, a mononuclear or polynuclear arene, a partially or fully substituted mononuclear or polynuclear arene, a mononuclear or polynuclear heteroarene and a partially or fully substituted mononuclear or polynuclear heteroarene. $R^A$ is selected from the group consisting of a (C1-C6) alkylene radical and a partially or fully halogenated (C1-C6) alkylene radical. $R^B$ radicals are selected independently of one another from the group consisting of a (C1-C10) alkyl radical, a partially or fully halogenated (C1-C10) alkyl radical and an O—$R^E$ alkyl ether radical. Radicals $R^E$ are selected independently of one another from the group consisting of a (C1-C10) alkyl radical, a partially or fully halogenated (C1-C10) alkyl radical, a benzyl radical, a partially or fully substituted benzyl radical, a mononuclear or polynuclear arene, a partially or fully substituted mononuclear or polynuclear arene, a mononuclear or polynuclear heteroarene and a partially or fully substituted mononuclear or polynuclear heteroarene. The method comprises the steps of:

a) providing a solution of lithium alkyl aluminate according to the general formula Li[AlR$_4$] (I) in at least one aprotic solvent, b) reacting the solution from step a) with a compound EX$_3$ in a reaction vessel, wherein
   E is selected from the group consisting of phosphorus, antimony and bismuth
and
   X=halogen, in particular X=F, Cl or Br,
and c) adding a solution or a suspension comprising a hydridic reducing agent in an aprotic solvent S$_Z$,
wherein
   a molar ratio EX$_3$:Li[AlR$_4$] (I) is ≥4
and
   a molar ratio EX$_3$:hydridic reducing agent is ≤1.

The compounds EX$_3$ to be used when using a lithium alkyl aluminate according to the general formula Li[AlR$_4$] (I) for preparing compounds according to the general formula (R)EH$_2$ (III) or in the method for preparing compounds according to the general formula (R)EH$_2$ (III) using a lithium alkyl aluminate according to the general formula Li[AlR$_4$] (I) are commercially available.

With the claimed use or method, for example tBuPH$_2$ (TBP) is obtainable in a particularly simple manner selectively and in good yield and high purity.

In one embodiment of the claimed use or method, the reaction according to step b) comprises adding the compound EX$_3$ as a solution in an aprotic solvent S$_F$ or as a solid to the solution of the lithium alkyl aluminate according to the general formula Li[AlR$_4$] (I) in the at least one aprotic solvent. In step c), a solution or suspension of the hydridic reducing agent in the aprotic solvent S$_Z$ is added to the reaction mixture from step b). Adding of the solution in step b) and of the solution or suspension in step c) can take place, for example, dropwise or by injection. If the compound EX$_3$ is added as a solid in step b), then, for example, a funnel or a funnel-like device is used for the addition.

In a further embodiment of the claimed use or method, the solvent S$_F$, the at least one aprotic solvent and the solvent S$_Z$ are selected independently of one another from the group consisting of hydrocarbons, benzene and benzene derivatives. For example, solvent S$_F$, the at least one aprotic solvent and solvent S$_Z$ are selected independently of one another from the group consisting of n-pentane, n-hexane, n-heptane, n-octane, n-nonane, n-decane, n-undecane, n-dodecane, cyclopentane, cyclohexane, cycloheptane, 1-pentene, 1-hexene, 1-heptene, 1-octene, 1-nonene, 1-decene, 1-undecene, 1-dodecene, cyclohexene, benzene, toluene, xylene and isomers thereof. It is also possible to use mixtures of two or more solvents, in particular mixtures of aliphatic hydrocarbons. Preferred are n-pentane, n-hexane, i-hexane and n-decane and possible mixtures.

A further embodiment of the claimed use or method provides for the solvent S$_F$, the at least one aprotic solvent and the solvent S$_Z$ to be miscible or identical.

A molar ratio E(X)$_2$R:hydridic reducing agent is chosen such that the two halide anions X$^-$ are replaced by two hydride ions H$^-$. The molar ratio E(X)$_2$R:hydridic reducing agent is preferably ≤1.

In one embodiment of the use of a lithium alkyl aluminate according to the general formula Li[AlR$_4$] (I) for preparing compounds according to the general formula (R)EH$_2$ (III) or of the method for preparing compounds according to the general formula (R)EH$_2$ (III) using a lithium alkyl aluminate according to the general formula Li[AlR$_4$] (I), the hydridic reducing agent is prepared in situ by reacting NaAlH$_4$ with a glycol ether. Here, a molar ratio NaAlH$_4$:glycol ether is 1:2, i.e. 0.5.

The definition of the phrase "prepared in situ" as used in the present invention has already been provided above.

In a further embodiment of the use of a lithium alkyl aluminate according to the general formula Li[AlR$_4$] (I) for preparing compounds according to the general formula (R)EH$_2$ (III) or of the method for preparing compounds according to the general formula (R)EH$_2$ (III) using a lithium alkyl aluminate according to the general formula Li[AlR$_4$] (I), the glycol ether is selected from the group consisting of a monoethylene glycol monoether, a diethylene glycol monoether, a triethylene glycol monoether, a monopropylene glycol monoether, a dipropylene glycol monoether and a tripropylene glycol monoether. A monoethylene glycol monoether or a diethylene glycol monoether is preferably used, particularly preferably ethylene glycol butyl ether or diethylene glycol monobutyl ether. A diethylene glycol monoether, in particular those in which the terminal alkyl group comprises at least four carbon atoms, is advantageous in its comparatively better solubility in aliphatic hydrocarbons. The latter are used in the method claimed herein preferably as solvents, especially n-pentane, n-hexane, n-heptane, n-octane, n-nonane, n-decane, n-undecane and n-dodecane and isomers thereof. Furthermore, cyclopentane, cyclohexane, cycloheptane, 1-pentene, 1-hexene, 1-heptene, 1-octene, 1-nonene, 1-decene, 1-undecene, 1-dodecene, cyclohexene, benzene, toluene and xylene and isomers thereof also find.

In another variant of the method for preparing a compound according to the general formula (R)EH$_2$ (III), the hydridic reducing agent is sodium bis(2-methoxyethoxy)-aluminum dihydride or lithium aluminum hydride. It is therefore a commercially available hydridic reducing agent. Sodium bis(2-methoxyethoxy)-aluminum dihydride is a dihydrido dialkoxy aluminate and is also known as Synhydrid, Red-Al® and Vitrid®. This reducing agent is commercially available in the form of a viscous, toluenic solution, an approximate weight fraction of >60 wt. % being stated.

In yet another variant of the use of a lithium alkyl aluminate according to the general formula Li[AlR$_4$] (I) for preparing compounds according to the general formula (R)EH$_2$ (III) and for the method for preparing compounds according to the general formula (R)EH$_2$ (III) using a lithium alkyl aluminate according to the general formula Li[AlR$_4$] (I), the solution comprising a lithium alkyl aluminate according to the general formula Li[AlR$_4$] (I) and at least one aprotic solvent is prepared in situ. This means that LiAlH$_4$ is reacted with RLi in a molar ratio of 1:4, i.e. 0.25, in an aprotic solvent. The reaction mixture present after the reaction, comprising a lithium alkyl aluminate according to the general formula Li[AlR$_4$] (I), can be subjected immediately, i.e. without any upstream purification step, to the reaction with EX$_3$. Before the addition of the hydridic reducing agent, the by-products contained in the reaction mixture, generally LiH and LiAlX, are separated off by filtration. The filtrate is intermittently collected in a further reaction vessel and can then be returned to the original reaction vessel, for example by means of a pumping operation. Consequently, the claimed use or method can also be carried out as one-pot synthesis.

The object is moreover achieved by compounds according to the general formula (R)EH$_2$ (III), obtainable by a method for preparing compounds according to the general formula (R)EH$_2$ (III) using a lithium alkyl aluminate according to the general formula Li[AlR$_4$] (I), according to any one of the above described embodiments. Compounds according to the general formula (R)EH$_2$ (III) that can be obtained with an embodiment of the method described above are characterized, in particular, by a high purity. For example, tBuPH$_2$ (TBP) is obtainable in a particularly simple manner selectively and in high purity.

With the claimed method, defined lithium alkyl aluminates according to the general formula Li[AlR$_4$] (I) can be prepared in a simple, cost-effective and reproducible manner in high purity and good yields. It is particularly advantageous that commercially available LiAlH$_4$ and RLi serve as reactants. Moreover, coordinating solvents, in particular ethers, are advantageously dispensed with. The compounds according to the general formula Li[AlR$_4$] (I) can be prepared in various non-ethereal organic solvents and exhibit good solubility in them, in particular in nonpolar solvents. No complex purification of the respectively isolated product by fractionating distillation and/or sublimation is required. The compounds of the Li[AlR$_4$] (I) type can be used to prepare defined stock solutions in nonpolar solvents and stored as such for later use. The compounds according to the general formula Li[AlR$_4$] are also characterized by the fact that they, also in the form of their parent solutions, enable selective transfer of one or more alkyl radicals R to a plurality of metal halides and elemental halides. Under the otherwise chosen reaction conditions, only by-products that are relatively easy to separate accrue, i.e. normally LiAlX$_4$ and in some cases LiX. It is furthermore advantageous that in the case of a transfer of four radicals R based on one molar equivalent of Li[AlR$_4$] (I), the resulting salt load is significantly reduced as compared to when using an alkylation reagent, by means of which only one radical R can be transferred per molar equivalent. The alkylation products are in turn characterized by a high purity. Overall, the claimed method is to be assessed as satisfactory from an ecological and economic point of view.

Other characteristics, details, and advantages of the invention follow from the wording of the claims as well as from the following description of the embodiment examples based upon the figures. The following are shown:

A BRIEF DESCRIPTION OF THE FIGURES

FIG. 1: $^{27}$Al-coupled $^1$H-NMR spectrum of Li[AltBu$_4$], prepared in accordance with Exemplary Embodiment 1, after simple recondensation, FIG. 2: $^1$H-coupled $^{27}$Al-NMR spectrum of Li[AltBu$_4$], prepared in accordance with Exemplary Embodiment 1, after simple recondensation, FIG. 3: $^{27}$Al-coupled $^{13}$C-NMR spectrum of Li[AltBu$_4$], prepared in accordance with Comparative Example 1, after simple recondensation, FIG. 4: $^1$H-decoupled $^{27}$Al-NMR spectrum of Li[AltBu$_4$], prepared in accordance with Exemplary Embodiment 1, after simple recondensation, FIG. 5: $^{27}$Al-coupled $^1$H-NMR spectrum of Li[Al(CH$_2$SiMe$_3$)$_4$], prepared in accordance with Exemplary Embodiment 2, after simple recondensation, FIG. 6: $^1$H-coupled $^{27}$Al-NMR spectrum of Li[Al(CH$_2$SiMe$_3$)$_4$], prepared in accordance with Exemplary Embodiment 2, after simple recondensation, and FIG. 7: $^1$H-coupled $^{31}$P-NMR spectrum of tBuPH$_2$, prepared in one-pot synthesis in accordance with Exemplary Embodiment 4, after fractional distillation.

Figure 5:
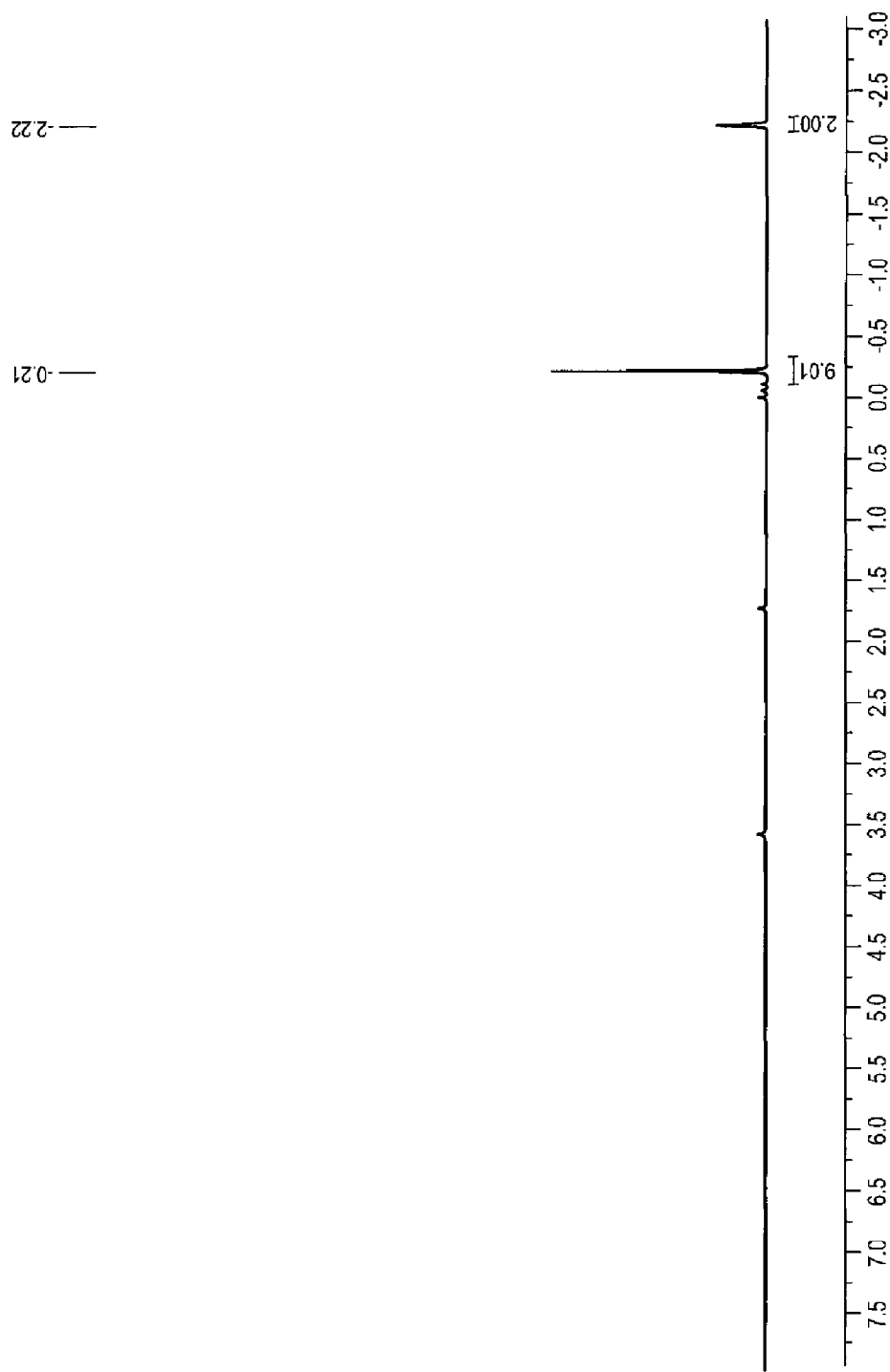
Figure 6:
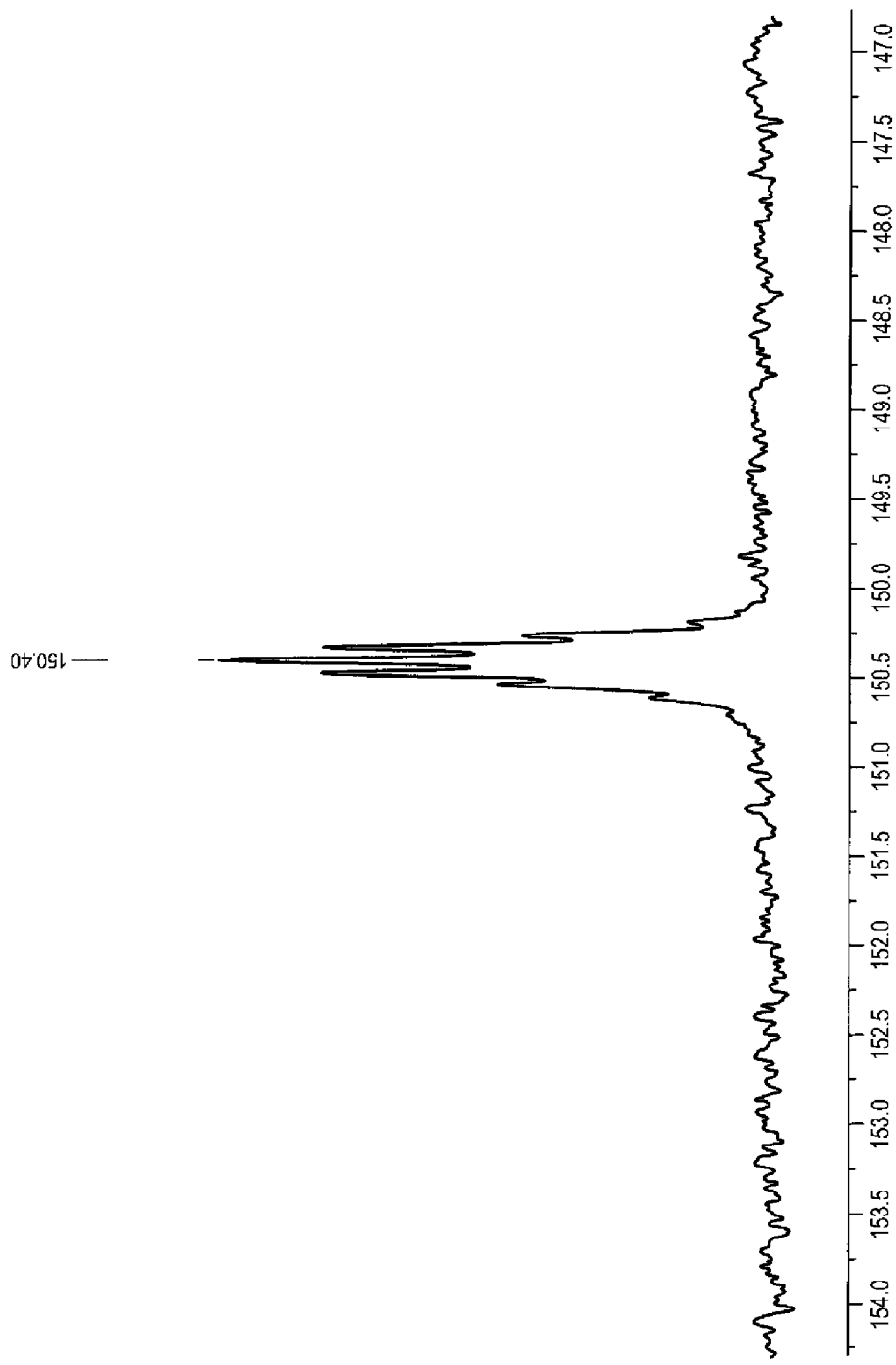
Figure 7:
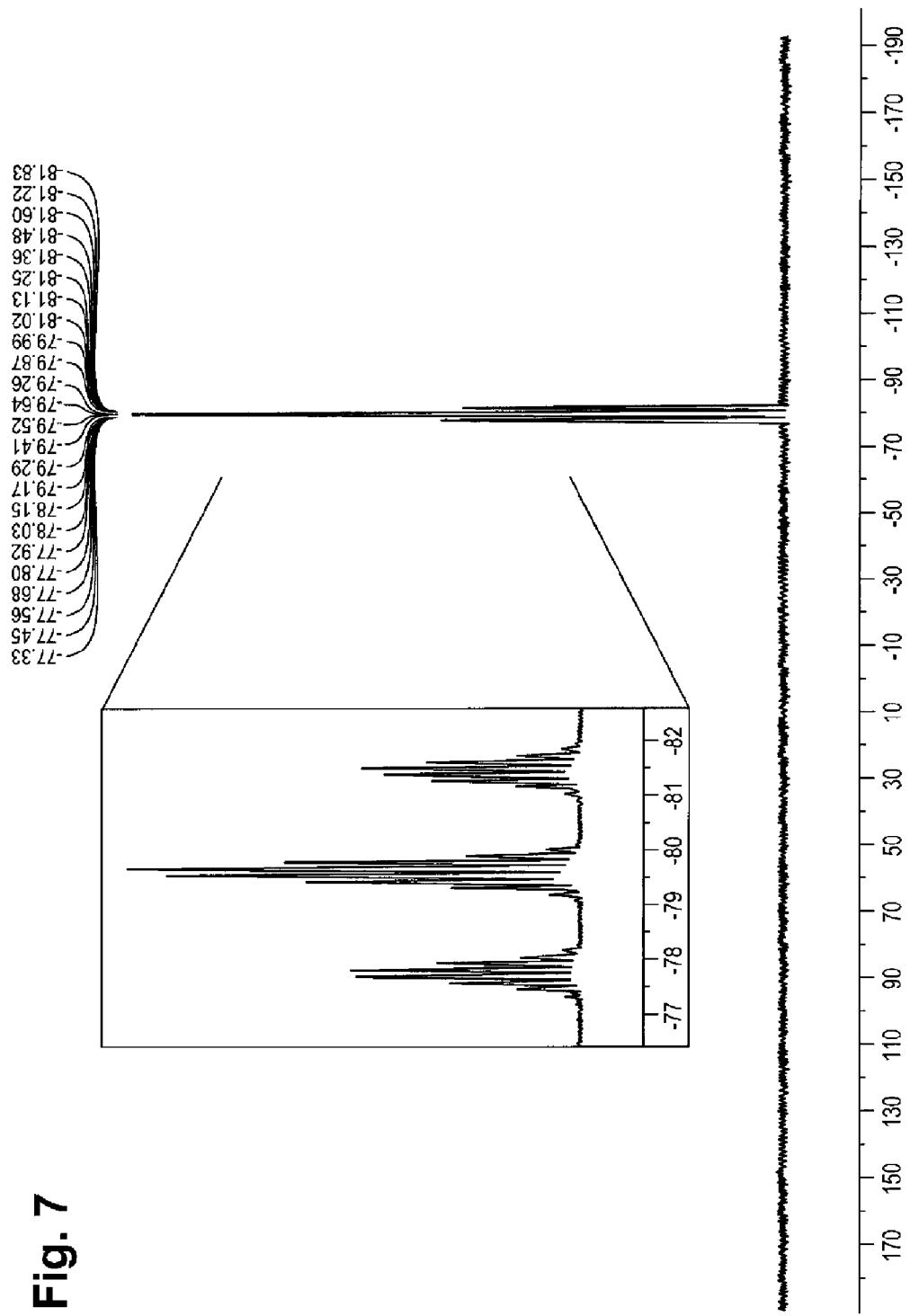

The NMR spectra shown in FIG. 1 to FIG. 6 were taken up in THF-$_{d8}$. n-decane was used as solvent for the measurement of the NMR spectrum shown in FIG. 7. The chemical shift δ is plotted in ppm in each case on the x-axis. The respective temperatures (in K) and frequencies (in MHz) at which the individual NMR spectra were recorded can be gathered from the process specifications, or more precisely from the respective evaluations of the NMR spectra shown in FIG. 1 to FIG. 7.

FIG. 1 shows a $^{27}$Al-coupled $^1$H-NMR spectrum of Li[AltBu$_4$], prepared in accordance with an embodiment of the claimed method (see Exemplary Embodiment 1). The product Li[AltBu$_4$] was isolated by simple condensation of the solvent n-pentane under fine vacuum (10$^{-2}$ to 10$^{-3}$ mbar). As can be seen in FIG. 1, only one signal is observed at a chemical shift δ$_H$ of 0.91 ppm. Splitting of the signal into a sextet with a coupling constant $^3J_{HAl}$=4 Hz is due to the nuclear spin quantum number of the coupling aluminum nucleus. The fact that only one signal can be observed in the $^{27}$Al-coupled $^1$H-NMR spectrum shown in FIG. 1 suggests a complete and selective reaction to the desired target product Li[AltBu$_4$].

Figure 2:
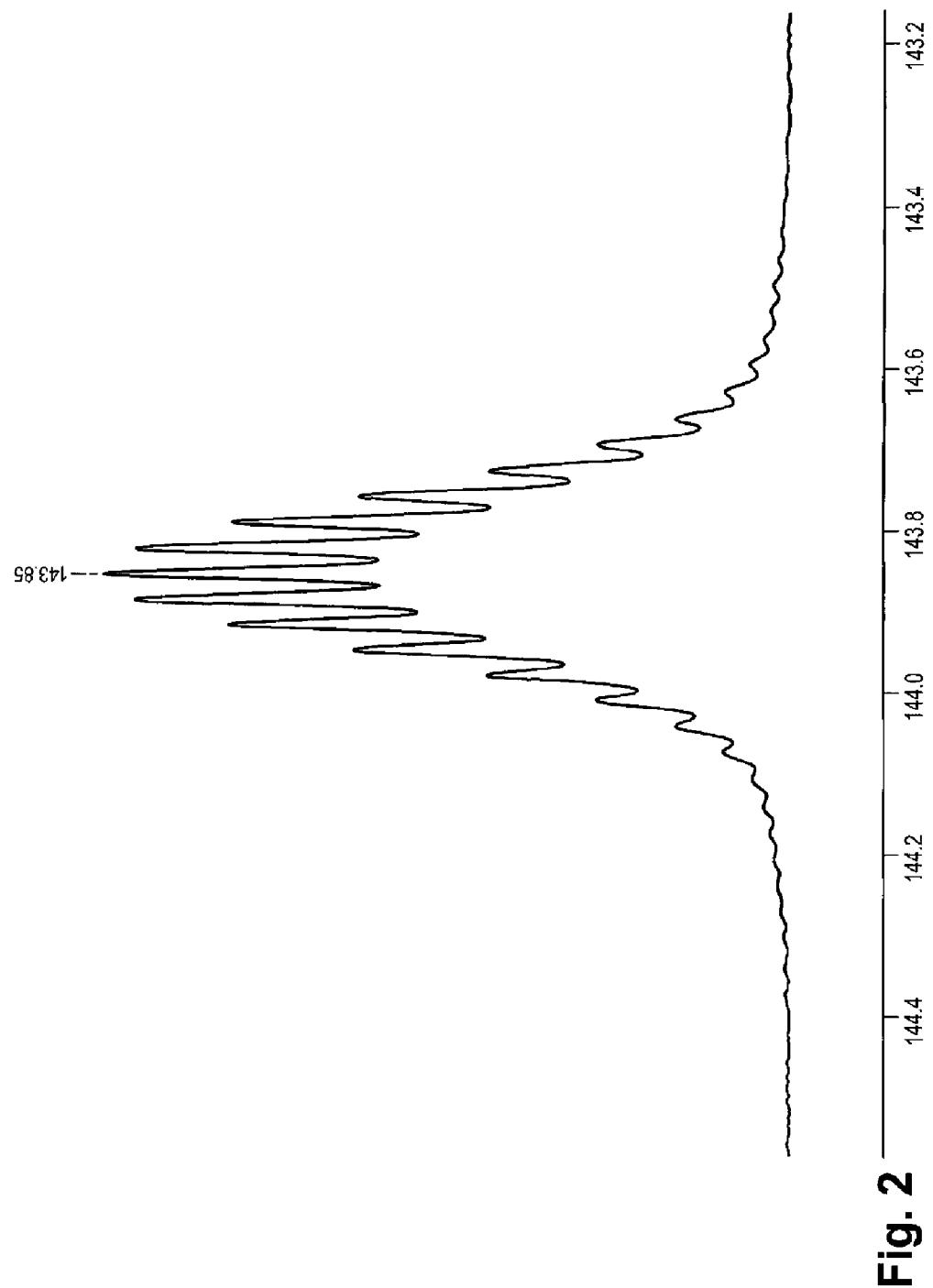

FIG. 2 shows a $^1$H-coupled $^{27}$Al-NMR spectrum of Li[AltBu$_4$]. The only signal at a chemical shift of δ$_{Al}$=143.9 ppm appears due to the coupling to 36 hydrogen atoms as multiplet, which—in accordance with the $^{27}$Al-coupled $^1$H-NMR spectrum of Li[AltBu$_4$] (see FIG. 1)—has a coupling constant $^3J_{AlH}$=4 Hz.

Figure 3:
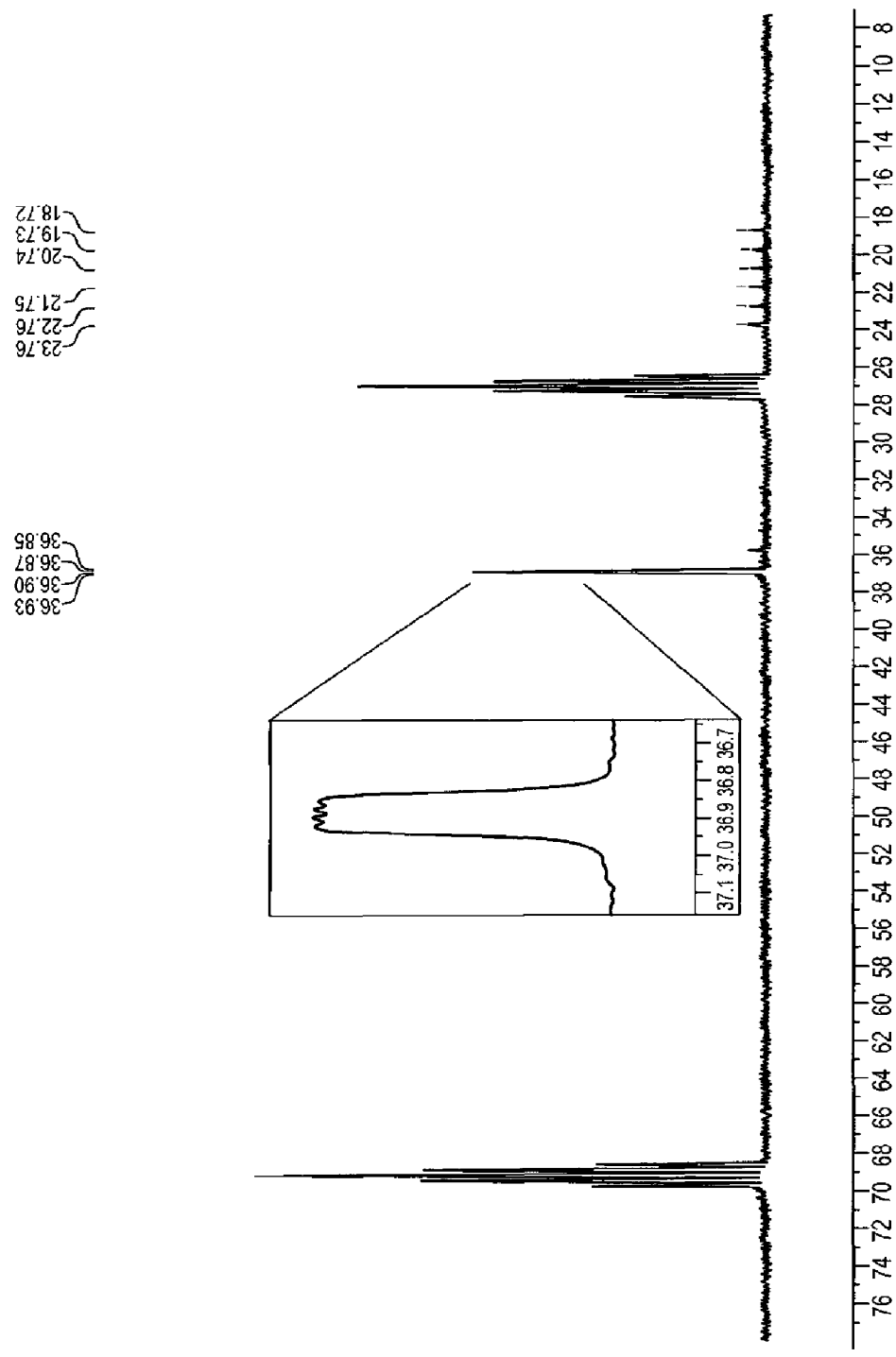
Figure 4:
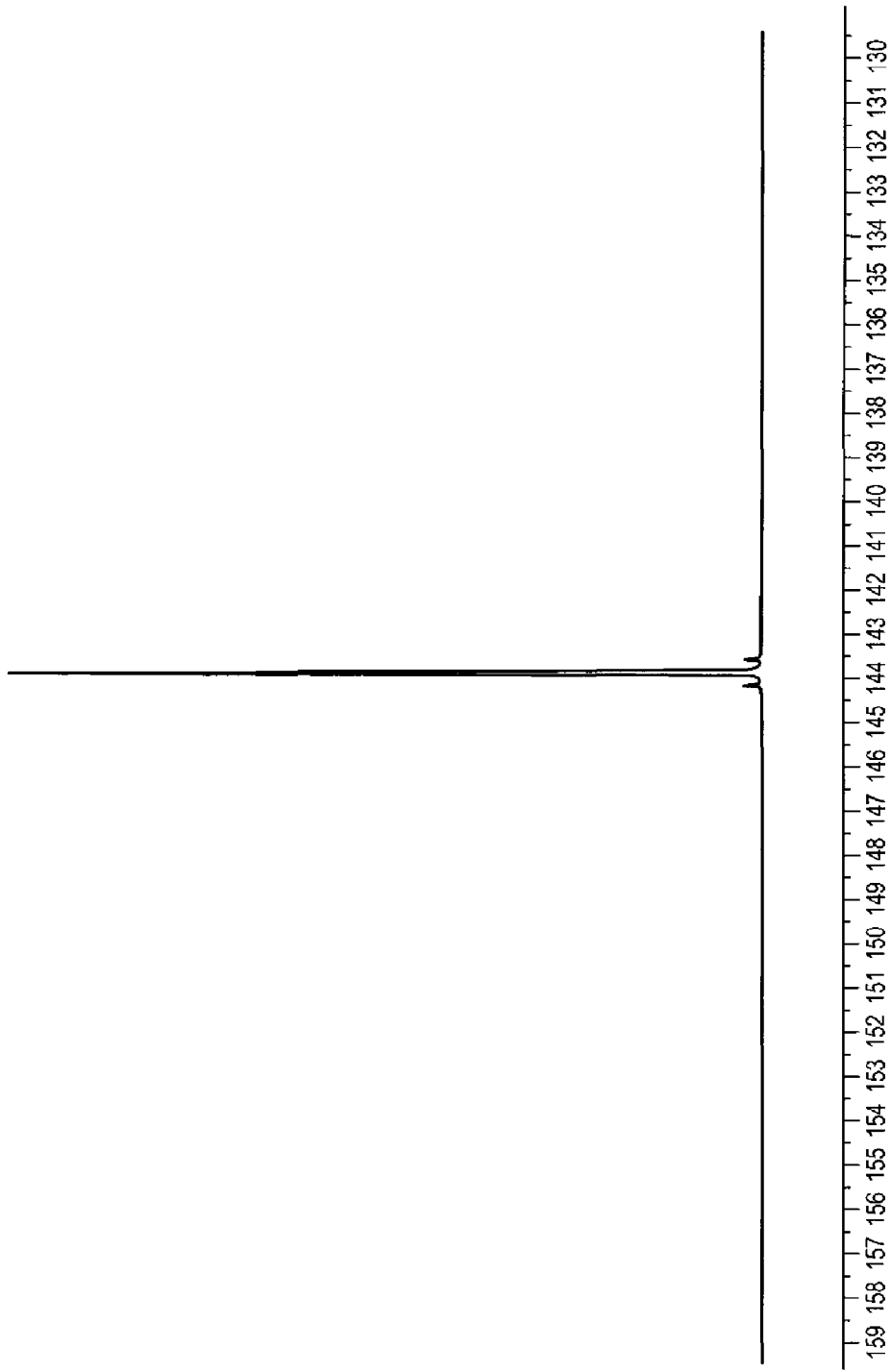

FIG. 3 shows a $^{27}$Al-coupled $^{13}$C-NMR spectrum of Li[AltBu$_4$] with a sextet as the only signal at a chemical shift δ$_C$=19.5 ppm. One coupling constant $^1J_{CAl}$ is 76 Hz. The same value was determined via satellites in a $^1$H-decoupled $^{27}$Al-NMR spectrum of Li[AltBu$_4$] (see FIG. 4).

FIG. 5 shows a $^{27}$Al-coupled $^1$H-NMR spectrum of Li[Al(CH$_2$SiMe$_3$)$_4$]. Two singlets can be observed for one CH$_2$SiMe$_3$ radical, wherein the CH$_2$ unit is detected at a chemical shift of δ$_H$=−2.22 ppm and the SiMe$_3$ group at a chemical shift δ$_H$=0.21 ppm. A $^1$H-coupled $^{27}$Al-NMR spectrum of Li[Al(CH$_2$SiMe$_3$)$_4$] (FIG. 6) shows only one signal at a chemical shift of δ$_{Al}$=150.4 ppm. This suggests a complete and selective reaction to the desired product Li[Al(CH$_2$SiMe$_3$)$_4$]. The signal observed in the $^1$H-coupled $^{27}$Al-NMR spectrum (FIG. 6) is downfield-shifted compared to the corresponding signal of Li[AltBu$_4$] (see FIG. 2). This can be explained by a comparatively lower electron density at the aluminum due to the less strong +1 effect of the CH$_2$SiMe$_3$ radical. A coupling constant $^2J_{AlH}$=9.1 Hz was determined based on the $^1$H-coupled $^{27}$Al-NMR spectrum (FIG. 6).

FIG. 7 shows a $^1$H-coupled $^{31}$P-NMR spectrum of tBuPH$_2$ (TBP) prepared in one-pot synthesis in accordance with Exemplary Embodiment 4, comprising isolation by fractional distillation. It can be seen from the $^{31}$NMR spectrum that the preparation of the desired product tBuPH$_2$ was effected selectively. The solvent n-decane used and the target compound tBuPH$_2$ have significantly different boiling points. Consequently, the two compounds were completely separated from one another by means of fractional distillation.

Process Specifications for the Synthesis of Li[AltBu$_4$], Li[Al(CH$_2$SiMe$_3$)$_4$], PCl$_2$tBu, tBuPH$_2$, PCltBu$_2$, PtBu$_3$, ZntBu$_2$, AltBu$_3$ and Al(CH$_2$SiMe$_3$)$_3$ Materials and Methods:

All reactions were carried out in a protective gas atmosphere. Work was carried out using conventional Schlenk techniques, with nitrogen or argon being used as protective gas. The corresponding vacuum rakes or Schlenk lines were connected to rotary vane pumps made by Vacuubrand. The educts, reagents and synthesized products were weighed and stored in glove boxes made by MBraun (model MB 150 BG-1 or Lab Master 130) under a nitrogen atmosphere.

The solvents used were dried according to standard procedures and stored in stainless steel columns over suitable drying agents (molecular sieve, aluminum oxide, copper catalyst). Solvents CDCl$_3$ and CD$_2$Cl$_2$ were dehydrated over molecular sieve 3 Å, condensed and then stored over molecular sieve 3 Å. In the case of gas injections of NH$_3$, said gas was first passed through a drying tube with KOH cookies.

All nuclear magnetic resonance spectroscopic measurements were performed in automated mode on an AV II 300 instrument or in manual mode on an AV III HD 250, AV III HD 300 or AV III 500 instrument. The heteronuclear NMR spectra $^7$Li, $^{13}$C, $^{27}$Al, $^{29}$Si, $^{31}$P were measured as standard $^1$H-broadband decoupled spectra at 300 K. Where $^{27}$Al- or $^{31}$P-NMR spectra were measured both as $^1$H decoupled and H coupled spectra, direct discrimination takes place such that the former is marked with $^{27}$Al{$^1$H}/$^{31}$P{$^1$H} and the latter with $^{27}$Al/$^{31}$P. $^1$H and $^{13}$C-NMR spectra were calibrated to the corresponding residual proton signal of the solvent as an internal standard: $^1$H: C$_6$D$_6$: 7.16 ppm (s), THF-d$_8$: 1.72 ppm (brs). $^{13}$C: C$_6$D$_6$: 128.0 ppm (t), THF-d$_8$: 25.2 ppm (quin). The chemical shifts are indicated in ppm and refer to the δ scale. All signals are provided with the following abbreviations according to their splitting pattern: s (singlet), quint (quintet), sext (sextet) or sept (septet); br (broad). The coupling between two nuclei A and B via n bonds is indicated by the coupling constant of the form $^nJ_{AB}$ in hertz (Hz).

In substance, the measurements of infrared spectra were usually performed on an Alpha ATR-IR spectrometer made by Bruker. The absorption bands are indicated in wave number (cm$^{-1}$), and the intensity is described with the following abbreviations: w (weak), m (moderate), st (strong), vst (very strong), br (broad). The spectra were always normalized to the band with the highest intensity.

The elemental analyses were carried out on a vario MICRO cube combustion device made by Elementar. Sample preparation was carried out in a glove box flooded with nitrogen by weighing the substance in tin crucibles, which were cold-welded and stored in a protective gas atmosphere until measurement. The elements of hydrogen, carbon and nitrogen were determined by means of a combustion analysis, wherein the information is always given in mass percent.

The thermogravimetric investigations were performed on a TGA/DSC 3+ STAR system made by Mettler Toledo. In the process, a coupled SDTA measurement was performed for each TGA. The samples were measured in aluminum oxide, aluminum or sapphire crucibles, depending on the method or state of aggregation. The sample was heated at a specific heating rate from 25° C. to the final temperature. The evaluation of the spectra obtained was carried out with STARe software made by Mettler Toledo.

Exemplary Embodiment 1: Preparation of Li[AltBu$_4$] in n-Pentane

LiAlH$_4$ (150 mg, 3.95 mmol, 1.00 eq) was provided in 10 mL of n-pentane and a solution of tBuLi in n-hexane (8.64 mL, 1.83 M, 15.8 mmol, 4.00 eq) was added dropwise. The LiAlH$_4$ used was observed to dissolve while a colorless solid precipitated. The colorless suspension was stirred for 16 h at room temperature. The emulsion-like reaction mixture was filtered, the filter cake was washed with 5 mL of n-pentane and the solvent of the filtrate was removed in a fine vacuum (10$^{-2}$ to 10$^{-3}$ mbar). The desired product was obtained as a colorless solid. The yield was 80% (824 mg, 3.14 mmol).

Alternatively, the product was isolated by decanting and subsequent drying. n-hexane and n-decane, for example, were used as alternative solvents.

$^1$H-NMR (C$_6$D$_6$, 300 MHz, 300 K): δ/ppm=1.10 (s, CMe$_3$); $^1$H-NMR (THF-d$_8$, 500 MHz, 300 K): δ/ppm=0.91 (sext, $^3J_{HAl}$=4 Hz, CMe$_3$); $^1$H{$^{27}$Al}-NMR (THF-d$_8$, 500 MHz, 300 K): δ/ppm=0.91 (s, CMe$_3$); $^{13}$C-NMR (C$_6$D$_6$, 75 MHz, 300 K): δ/ppm=33.3 (s, CMe$_3$); $^{13}$C-NMR (THF-d$_8$, 75 MHz, 300 K): δ/ppm=19.5 (sext, $^1J_{CAl}$=76 Hz, CMe$_3$), 35.1 (brs, CMe$_3$); $^7$Li-NMR (THF-d$_8$, 117 MHz, 300 K): δ/ppm=−0.48 (s); $^{27}$Al-NMR (THF-d$_8$, 130 MHz, 300 K): δ/ppm=143.9 (m, $^3J_{AlH}$=4 Hz); $^{27}$Al{$^1$H}-NMR (THF-d$_8$, 130 MHz, 300 K): δ/ppm=143.9 (s); IR: υ/cm$^{-1}$=2955 (m), 2933 (m), 2864 (m), 2814 (vst), 1496 (w), 1467 (m), 1382 (m), 1259 (w), 1170 (w), 1005 (w), 916 (m), 805 (st), 784 (vstbr), 557 (w), 523 (st), 439 (st).

Exemplary Embodiment 2: Preparation of Li[Al(CH$_2$SiMe$_3$)$_4$] in n-Pentane

LiAlH$_4$ (100 mg, 2.64 mmol, 1.00 eq) was suspended in 10 mL of n-pentane and cooled to 0° C. A solution of LiCH$_2$SiMe$_3$ (992 mg, 10.5 mmol, 4.00 eq) in 15 mL of n-pentane was added dropwise at room temperature. The colorless reaction mixture was stirred for 1 h at 0° C., then for 48 h at room temperature. The precipitated colorless solid was filtered and the solvent of the filtrate was removed in a fine vacuum (10$^{-2}$ to 10$^{-3}$ mbar). The product was obtained as a colorless solid with a yield of 39% (399 mg, 1.04 mmol).

The yield can be increased by repeatedly extracting the filter cake.

$^1$H-NMR (C$_6$D$_6$, 300 MHz, 300 K): δ/ppm=−2.04 (s, 8H, CH$_2$SiMe$_3$), 0.18 (s, 36H, CH$_2$SiMe$_3$); $^1$H-NMR (THF-d$_8$, 300 MHz, 300 K): δ/ppm=−2.22 (s, 8H, CH$_2$SiMe$_3$), 0.21 (s, 36H, CH$_2$SiMe$_3$); $^{13}$C-NMR (C$_6$D$_6$, 75 MHz, 300 K): δ/ppm=−4.6 (s, CH$_2$SiMe$_3$), 3.6 (s, CH$_2$SiMe$_3$); $^{13}$C-NMR (THF-d$_8$, 75 MHz, 300 K): δ/ppm=−7.0 (s, CH$_2$SiMe$_3$), 6.0 (s, CH$_2$SiMe$_3$); $^7$Li-NMR (C$_6$D$_6$, 117 MHz, 300 K): δ/ppm=1.3 (s); $^7$Li-NMR (THF-d$_8$, 117 MHz, 300 K): δ/ppm=1.3 (s); $^{27}$Al-NMR (C$_6$D$_6$, 130 MHz, 300 K): δ/ppm=150.7 (quint, $^2J_{AlH}$=9.0 Hz); $^{27}$Al-NMR (THF-ds, 130 MHz, 300 K): δ/ppm=150.4 (sept, $^2J_{AlH}$=9.1 Hz); $^{27}$Al{$^1$H}-NMR (C$_6$D$_6$, 130 MHz, 300 K): δ/ppm=150.6 (s); $^{27}$Al{$^1$H}-NMR (THF-d$_8$, 130 MHz, 300 K): δ/ppm=150.4 (s); $^{29}$Si{$^1$H}-NMR (THF-d$_8$, 99 MHz, 300 K): δ/ppm=−3.9 (s); IR: υ/cm$^{-1}$=2945 (m), 2890 (w), 2815 (w), 2787 (w), 1430 (w), 1241 (st), 1046 (w), 935 (w), 851 (vst), 811 (vst), 714 (vst), 668 (st), 603 (w), 454 (st); elemental analysis: for $C_{16}H_{44}AlLiSi_4$: calculated: C: 50.20%, H: 11.59%, N: 0.00%, found: C: 49.53%, H: 10.93%, N: 0.25%. The determined nitrogen content of the sample can be explained by the sample's preparation in a nitrogen-flooded glove box.

Exemplary Embodiment 3: Transfer of One Tert-Butyl Group to $PCl_3$ in n-Pentane Using $Li[AltBu_4]$ as Transfer Reagent $PCl_3$ (746 mg, 5.43 mmol, 4.00 eq) was provided in 15 mL of n-pentane and cooled to 0° C. A solution of $Li[AltBu_4]$ (356 mg, 1.36 mmol, 1.00 eq) in 20 mL of n-pentane was added dropwise, wherein precipitation of a colorless solid was observed. The reaction mixture was stirred for 16 h at room temperature and then examined by means of $^{31}$P-NMR spectroscopy.

Synthesis was alternatively carried out, for example, in toluene, n-hexane and n-decane. Distillation of $PCl_2tBu$ from toluene provided an 84% yield.

$^{31}$P-NMR (n-pentane, 101 MHz, 300 K): δ/ppm=197.2.

The chemical shift observed is consistent with that reported in the literature for $PCl_2tBu$. (Y. Liu, B. Ding, D. Liu, Z. Zhang, Y. Liu, W. Zhang, *Res. Chem. Intermed.* 2017, 43, 4959-4966)

Exemplary Embodiment 4: Preparation of $tBuPH_2$ Using a Solution of $Li[AltBu_4]$ in n-Decane Prepared In Situ (One-Pot Synthesis)

$PCl_3$ (1.45 g, 10.6 mmol, 4.00 eq) was provided in 15 mL of n-pentane and cooled to 0° C. A solution of $Li[AltBu_4]$ prepared in situ based on $LiAlH_4$ (100 mg, 2.65 mmol, 1.00 eq) and tBuLi (5.8 mL, 1.83 M, 10.6 mmol, 4.00 eq) in 20 mL of n-decane was slowly added dropwise, wherein a colorless solid precipitated. The reaction mixture was stirred at room temperature for 1 hr, cooled to 0° C. and mixed with $Na[AlH_2(OC_2H_4OC_2H_4OnBu)_2]$ prepared in situ based on $NaAlH_4$ (570 mg, 10.6 mmol, 4.00 eq) and 2-(2-butoxyethoxy)ethanol (3.42 g, 21.1 mmol, 8.00 eq) in 10 mL of n-decane. The reaction mixture was slowly heated to room temperature and stirred for 1 h. The product was recondensed together with n-decane in a fine vacuum ($10^{-2}$ to $10^{-3}$ mbar). The desired product $tBuPH_2$ (850 mg, 9.43 mmol) was isolated by fractional distillation to give an 89% yield of a colorless liquid.

The reaction can be carried out in an analogous manner in n-pentane, but the latter cannot be separated from the product by fractional distillation.

Intermediate: $^{31}$P-NMR (n-decane, 101 MHz, 300 K): δ/ppm=197.2.

Final product: $^{31}$P-NMR (n-decane, 101 MHz, 300 K): δ/ppm=−80.3.

Exemplary Embodiment 5: Transfer of Two Tert-Butyl Groups to $PCl_3$ in n-Hexane Using $Li[AltBu_4]$ as Transfer Reagent $Li[AltBu_4]$ (75 mg, 0.29 mmol, 2.00 eq) was provided in 8 mL of n-hexane, cooled to 0° C. and mixed with $PCl_3$ (80 mg, 0.58 mmol, 4.00 eq). The reaction mixture was heated to room temperature and stirred for 16 h. The slightly yellow suspension was filtered through a syringe filter and the filtrate was examined by means of $^{31}$P-NMR spectroscopy.

$^{31}$P-NMR (n-pentane, 101 MHz, 300 K): δ/ppm=144.9.

The chemical shift observed is consistent with that reported in the literature for $PCltBu_2$. (F. Eisenträger, A. Göthlich, I. Gruber, H. Heiss, C. A. Kiener, C. Krüger, J. Ulrich Notheis, F. Rominger, G. Scherhag, M. Schultz, B. F. Straub, M. A. O. Volland, P. Hofmann, *New J. Chem.* 2003, 27, 540-550)

Exemplary Embodiment 6: Transfer of Three Tert-Butyl Groups to $PCl_3$ in Toluene Using $Li[AltBu_4]$ as Transfer Reagent $Li[AltBu_4]$ (75 mg, 0.29 mmol, 3.00 eq) was provided in 8 mL of toluene and cooled to 0° C. $PCl_3$ (53 mg, 0.39 mmol, 4.00 eq) was added dropwise. The reaction mixture was heated to room temperature and stirred for 16 h. The slightly yellow suspension was filtered through a syringe filter and the filtrate was examined by means of $^{31}$P-NMR spectroscopy.

$^{31}$P-NMR (toluene, 101 MHz, 300 K): δ/ppm=58.0.

The chemical shift observed is consistent with that reported in the literature for $PtBu_3$. (L. Rösch, W. Schmidt-Fritsche, Z. Anorg. Allg. Chem. 1976, 426, 99-106)

Exemplary Embodiment 7: Transfer of Two Tert-Butyl Groups to $ZnCl_2$ in n-Hexane Using $Li[AltBu_4]$ as Transfer Reagent $ZnCl_2$ (100 mg, 0.73 mmol, 1.00 eq) was provided in 10 mL of n-hexane and cooled to −40° C. A solution of $Li[AltBu_4]$ (96 mg, 0.37 mmol, 0.50 eq) in 10 mL of n-hexane was added dropwise. The grayish suspension was kept at a temperature of −40° C. for 8 h and then slowly heated to room temperature. The suspension was filtered, cooled to −10° C. and freed from the solvent. $ZntBu_2$ was obtained after repeated freeze-drying as a colorless solid with a yield of approximately 30% (40 mg, 0.22 mmol). The colorless solid can be sublimated under slightly reduced pressure at room temperature or recondensed at 40° C.

$^1$H-NMR ($C_6D_6$, 300 MHz, 300 K): δ/ppm=0.85 (s, $CMe_3$).

No signal was detected in the $^7$Li-NMR spectrum or in the $^{27}$Al-NMR spectrum. A complete reaction was therefore effected.

Exemplary Embodiment 8: Transfer of Three Tert-Butyl Groups to $AlCl_3$ in n-Pentane Using $Li[AltBu_4]$ as Transfer Reagent $AlCl_3$ (70 mg, 0.53 mmol, 1.00 eq) was provided in 10 mL of n-pentane, cooled to −40° C. and mixed with a solution of $Li[AltBu_4]$ (417 mg, 1.59 mmol, 3.00 eq) in 20 mL of n-pentane. The reaction mixture was stirred for 3 h at −40° C. and for 16 h at room temperature. The slightly gray suspension was filtered at 0° C. and the solvent of the filtrate was removed at −10° C. The product $AltBu_3$ was obtained in the form of colorless crystals with a yield of 82% (345 mg, 1.74 mmol).

$^1$H-NMR ($C_6D_6$, 300 MHz, 300 K): δ/ppm=1.18 (s, $CMe_3$), $^{13}$C-NMR ($C_6D_6$, 75 MHz, 300 K): δ/ppm=32.0 ($CMe_3$).

The quaternary carbon atom was not detected in the $^{13}$C-NMR spectrum.

Exemplary Embodiment 9: Transfer of Three Tert-Butyl Groups to $AlCl_3$ in n-Pentane Using $Li[AltBu_4]$ as Transfer Reagent on a Larger Scale $AlCl_3$ (700 mg, 5.30 mmol, 1.00 eq) was provided in 120 mL of n-pentane, cooled to −40° C. and mixed with a solution of Li[AltBu₄] (4.17 g, 15.9 mmol, 3.00 eq) in 250 mL of n-pentane which was pre-cooled to 0° C. The reaction mixture was stirred for 10 h at −40° C. and for 16 h at room temperature. The gray suspension was filtered at 0° C. and the solvent of the filtrate was removed at −10° C. The product was obtained in the form of a crystalline solid with a yield of 76% (3.19 g, 16.1 mmol).

Exemplary Embodiment 10: Transfer of Three CH₂SiMe₃ Groups to AlCl₃ in n-Pentane Using Li[Al(CH₂SiMe₃)₄] as Transfer Reagent AlCl₃ (80 mg, 0.61 mmol, 1.00 eq) was provided in 10 mL of n-pentane, cooled to −40° C. and mixed with a solution of Li[Al(CH₂SiMe₃)₄] (701 mg, 1.59 mmol, 3.00 eq) in 10 mL of n-pentane. The reaction mixture was stirred for 6 h at −40° C. and for 16 h at room temperature. After filtration, the solvent of the filtrate was removed at −10° C. in a fine vacuum ($10^{-2}$ to $10^{-3}$ mbar). The product was recondensed in a fine vacuum ($10^{-2}$ to $10^{-3}$ mbar) at 55° C. and obtained as a colorless liquid. The yield was 67% (424 mg, 1.47 mmol).

¹H-NMR (C₆D₆, 300 MHz, 300 K): δ/ppm=−2.00 (s, 6H, CH₂SiMe₃), −0.25 (s, 27H, CH₂SiMe₃).

It is clear that the invention relates to lithium alkyl aluminates according to the general formula Li[AlR₄] and to a method for preparing same, starting from LiAlH₄ and RLi in a non-ethereal solvent. The invention also relates to compounds according to the general formula Li[AlR₄] which can be obtained using the claimed method, and to the use thereof. The invention further relates to the use of a lithium alkyl aluminate according to the general formula Li[AlR₄] as a transfer reagent for transferring at least one radical R to an element halide or metal halide and to a method for transferring at least one radical R to a compound according to the general formula $E(X)_q$ for preparing a compound according to the general formula $E(X)_{q-p}R_p$. E is selected from the group consisting of aluminum, gallium, indium, thallium, germanium, tin, lead, antimony, bismuth, zinc, cadmium, mercury and phosphorus, X=halogen, q=2, 3 or 4, and p=1, 2, 3 or 4. The invention also relates to compounds which can be obtained according to an embodiment of such a method, to the use thereof, and to a substrate which has an aluminum layer or a layer containing aluminum on one surface.

With the claimed method, defined lithium alkyl aluminates according to the general formula Li[AlR₄] (I) can be prepared in a simple, cost-effective and reproducible manner in high purity and good yields. The method can also be carried out on an industrial scale. Coordinating solvents, in particular ethers, are advantageously dispensed with. The compounds according to the general formula Li[AlR₄] are also characterized by the fact that, also in the form of their parent solutions, they enable selective transfer of one or more alkyl radicals R to a plurality of metal halides and elemental halides. Under the otherwise chosen reaction conditions, only by-products that are relatively easy to separate accrue, i.e. normally LiAlX₄ and in some cases LiX. It is furthermore advantageous that in the case of a transfer of four radicals R based on one molar equivalent of Li[AlR₄] (I), the resulting salt load is significantly reduced as compared to when using an alkylation reagent, by means of which only one radical R can be transferred per molar equivalent. The alkylation products are in turn characterized by a high purity and are therefore particularly suitable as precursors for vapor deposition methods. The compounds AlR₃ which can be prepared by the claimed method are suitable as precursors for preparing high-quality aluminum layers or layers containing aluminum.

All features and advantages resulting from the claims, the description and the figures, including constructive details, spatial arrangements and method steps, can be essential to the invention, both in themselves and in the most diverse combinations.

The invention claimed is:

1. A method for preparing lithium alkyl aluminates according to the general formula Li[AlR₄]  (I)

wherein

R is selected from the group consisting of a (C1-C10) alkyl radical, a partially or fully halogenated (C1-C10) alkyl radical, a (trialkylsilyl) alkyl radical $R^A$—Si($R^B$)₃, a benzyl radical, a partially or fully substituted benzyl radical, a mononuclear or polynuclear arene, a partially or fully substituted mononuclear or polynuclear arene, a mononuclear or polynuclear heteroarene and a partially or fully substituted mononuclear or polynuclear heteroarene, wherein $R^A$ is selected from the group consisting of a (C1-C6) alkylene radical and a partially or fully halogenated (C1-C6) alkylene radical, $R^B$ radicals are selected independently of one another from the group consisting of a (C1-C10) alkyl radical, a partially or fully halogenated (C1-C10) alkyl radical and an O—$R^E$ alkyl ether radical, wherein radicals $R^E$ are selected independently of one another from the group consisting of a (C1-C10) alkyl radical, a partially or fully halogenated (C1-C10) alkyl radical, a benzyl radical, a partially or fully substituted benzyl radical, a mononuclear or polynuclear arene, a partially or fully substituted mononuclear or polynuclear arene, a mononuclear or polynuclear heteroarene and a partially or fully substituted mononuclear or polynuclear heteroarene, comprising the step of:

Reacting LiAlH₄ with a compound according to the general formula RLi, wherein

R is selected from the group consisting of a (C1-C10) alkyl radical, a partially or fully halogenated (C1-C10) alkyl radical, a (trialkylsilyl) alkyl radical $R^A$—Si($R^B$)₃, a benzyl radical, a partially or fully substituted benzyl radical, a mononuclear or polynuclear arene, a partially or fully substituted mononuclear or polynuclear arene, a mononuclear or polynuclear heteroarene and a partially or fully substituted mononuclear or polynuclear heteroarene, wherein $R^A$ is selected from the group consisting of a (C1-C6) alkylene radical and a partially or fully halogenated (C1-C6) alkylene radical, $R^B$ radicals are selected independently of one another from the group consisting of a (C1-C10) alkyl radical, a partially or fully halogenated (C1-C10) alkyl radical and an O—$R^E$ alkyl ether radical, wherein radicals $R^E$ are selected independently of one another from the group consisting of a (C1-C10) alkyl radical, a partially or fully halogenated (C1-C10) alkyl radical, a benzyl radical, a partially or fully substituted benzyl radical, a mononuclear or polynuclear arene, a partially or fully substituted mononuclear or polynuclear arene, a mononuclear or polynuclear heteroarene and a partially or fully substituted mononuclear or polynuclear heteroarene,
in at least one aprotic solvent in a reaction vessel,
wherein a molar ratio LiAlH$_4$:RLi is ≥0.25.

2. The method according to claim 1, wherein R is selected from the group consisting of Me, Et, nPr, iPr, nBu, tBu, sBu, iBu, CH(Me)(iPr), CH(Me)(nPr), CH(Et)$_2$, CH(Et)(Me)$_2$, CH$_2$C$_6$H$_5$, C$_6$H$_5$, CH$_2$SiMe$_3$, CH$_2$SiEt$_3$, CH$_2$Si(Me)$_2$(OMe), CH$_2$Si(Et)$_2$(OEt), CH$_2$Si(Me)(tBu)(OMe), CH$_2$Si(tBu)(C$_6$H$_5$)(OtBu) and CH$_2$Si(iPr)$_2$(OiPr).

3. The method according to claim 1, wherein the reaction of LiAlH$_4$ with compound RLi comprises the steps of:
   i) providing a solution or a suspension of LiAlH$_4$ in a first solvent S1,
   ii) adding the compound RLi,
   wherein during and/or after the addition of RLi, a reaction of LiAlH$_4$ with the compound RLi takes place.

4. The method according to claim 1, wherein the compound RLi is added in a form suspended or dissolved in a second solvent S2.

5. The method according to claim 4, wherein the second solvent S2 is miscible with or identical to the first solvent S1.

6. The method according to claim 4, wherein the first solvent S1 and the second solvent S2 are selected independently of one another from the group consisting of hydrocarbons, benzene and benzene derivatives.

7. The method according to claim 1, wherein the reaction of LiAlH$_4$ with the compound RLi is carried out at an internal temperature T$_U$ of the reaction vessel, the internal temperature T$_U$ being between −30° C. and 100° C.

8. The method according to claim 3, wherein an internal temperature T$_H$ of the reaction vessel during and/or after the addition of the compound RLi is between −40° C. and 80° C.

9. The method according to claim 1, wherein the step comprising the reaction of LiAlH$_4$ with compound RLi is followed by a further step comprising the isolation of Li[AlR$_4$]:
   i) as a solution,
      comprising Li[AlR$_4$] (I) and the at least one aprotic solvent,
      or
   ii) as a solid.

10. The method according to claim 1, wherein isolation comprises a filtration step.

11. A method for preparing compounds according to the general formula (R)EH$_2$(III), using
a lithium alkyl aluminate according to the general formula Li[AlR$_4$] (I),
wherein
R is selected from the group consisting of a (C1-C10) alkyl radical, a partially or fully halogenated (C1-C10) alkyl radical, a (trialkylsilyl) alkyl radical R$^A$—Si(R$^B$)$_3$, a benzyl radical, a partially or fully substituted benzyl radical, a mononuclear or polynuclear arene, a partially or fully substituted mononuclear or polynuclear arene, a mononuclear or polynuclear heteroarene and a partially or fully substituted mononuclear or polynuclear heteroarene,
wherein
R$^A$ is selected from the group consisting of a (C1-C6) alkylene radical and a partially or fully halogenated (C1-C6) alkylene radical,
R$^B$ radicals are selected independently of one another from the group consisting of a (C1-C10) alkyl radical, a partially or fully halogenated (C1-C10) alkyl radical and an O—R$^E$ alkyl ether radical,
wherein radicals R$^E$ are selected independently of one another from the group consisting of a (C1-C10) alkyl radical, a partially or fully halogenated (C1-C10) alkyl radical, a benzyl radical, a partially or fully substituted benzyl radical, a mononuclear or polynuclear arene, a partially or fully substituted mononuclear or polynuclear arene, a mononuclear or polynuclear heteroarene and a partially or fully substituted mononuclear or polynuclear heteroarene,
comprising the steps of:
a) providing a solution of lithium alkyl aluminate according to the general formula Li[AlR$_4$] (I) in at least one aprotic solvent,
b) reacting the solution from step a) with a compound EX3 in a reaction vessel,
wherein
E is selected from the group consisting of phosphorus, antimony and bismuth
and
X=halogen,
and
c) adding a solution or a suspension comprising a hydridic reducing agent in an aprotic solvent S$_Z$,
wherein
a molar ratio EX$_3$:Li[AlR$_4$] (I) is ≥4
and
a molar ratio EX$_3$:reducing agent is ≤1.

12. The method according to claim 11, wherein the hydridic reducing agent is prepared in situ by reacting NaAlH$_4$ with a glycol ether,
wherein a molar ratio NaAlH$_4$:glycol ether is 0.5.

13. The method according to claim 12, wherein the glycol ether is selected from the group consisting of a monoethylene glycol monoether, a diethylene glycol monoether, a triethylene glycol monoether, a monopropylene glycol monoether, a dipropylene glycol monoether and a tripropylene glycol monoether.

* * * * *